(12) United States Patent
Fukuda et al.

(10) Patent No.: US 8,368,483 B2
(45) Date of Patent: Feb. 5, 2013

(54) MULTIBAND MATCHING CIRCUIT AND MULTIBAND POWER AMPLIFIER

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 434 days.

(21) Appl. No.: 12/693,809

(22) Filed: Jan. 26, 2010

(65) Prior Publication Data
US 2010/0194491 A1 Aug. 5, 2010

(30) Foreign Application Priority Data

Jan. 30, 2009 (JP) ................................. 2009-020577
Dec. 25, 2009 (JP) ................................. 2009-295446

(51) Int. Cl.
*H03H 7/38* (2006.01)
(52) U.S. Cl. .............................. 333/32; 333/33; 333/124
(58) Field of Classification Search .................... 333/32, 333/33, 124
See application file for complete search history.

(56) References Cited

U.S. PATENT DOCUMENTS

| | | |
|---|---|---|
| 2002/0118075 A1 | 8/2002 | Ohwada et al. |
| 2006/0261911 A1 | 11/2006 | Fukuda et al. |
| 2007/0018758 A1 | 1/2007 | Fukuda et al. |
| 2008/0129410 A1 | 6/2008 | Fukuda et al. |
| 2008/0150630 A1 | 6/2008 | Fukuda et al. |
| 2008/0278260 A1 | 11/2008 | Fukuda et al. |

FOREIGN PATENT DOCUMENTS

| | | |
|---|---|---|
| CN | 101304244 A | 11/2008 |
| EP | 1 605 589 A1 | 12/2005 |
| EP | 1 998 437 A1 | 12/2008 |
| JP | 2007-150407 | 6/2007 |
| JP | 2009-20581 | 1/2009 |
| KR | 10-2008-0099809 | 11/2008 |

OTHER PUBLICATIONS

Office Action issued Oct. 4, 2011 in Korean Patent Application No. 10-2010-0006899 (with English translation).
Office Action issued Dec. 9, 2010, in Europe Patent Application No. 10 151 930.4.
Atsushi Fukuda et al., "Multi-band Power Amplifier Employing MEMS Switches for Optimum Matching", Proceedings of Institute of Electronics, Information and Communication Engineers General Conference 2004, C-2-4, p. 39, with Partial English Translation.
Office Action issued May 17, 2012, in Chinese Patent Application No. 201010108107.X (with English-language translation).

*Primary Examiner* — Robert Pascal
*Assistant Examiner* — Kimberly Glenn
(74) *Attorney, Agent, or Firm* — Oblon, Spivak, McClelland, Maier & Neustadt, L.L.P.

(57) ABSTRACT

A multiband matching circuit includes a first matching unit, a second matching unit, and a third matching unit, with all units being connected in series in a signal path. Matching with target impedance is established at a first frequency by appropriately designing the first matching unit and at a second frequency by appropriately designing the second and third matching units. The second matching unit and the third matching unit are designed to make the conversion ratio of the impedance viewed from the connection point between the second matching unit and the third matching unit to a circuit element to the target impedance smaller than the conversion ratio of the impedance viewed from the connection point between the first matching unit and the second matching unit to the circuit element to the target impedance, at the second frequency.

12 Claims, 40 Drawing Sheets

MULTIBAND MATCHING CIRCUIT AND MULTIBAND POWER AMPLIFIER

BACKGROUND OF THE INVENTION

1. Field of the Invention

The present invention relates to matching circuits used in amplifiers and the like and to power amplifiers. More specifically, the present invention relates to a low-loss multiband matching circuit that can establish matching between the input-output impedance of a circuit element having frequency characteristics such as an amplification device and the characteristic impedance of a peripheral circuit in a plurality of frequency bands and to a multiband power amplifier having the low-loss multiband matching circuit.

2. Description of the Related Art

One requirement of radio equipment is the capability of dealing with signals in a plurality of frequency bands (multiband). An indispensable component included in radio equipment is a power amplifier. Something that is needed for efficient amplification is a multiband matching circuit that can establish impedance matching between the input impedance $Z_I(f)$ and output impedance $Z_L(f)$ of an amplification device having frequency characteristics, such as a transistor, and the input-output impedance $Z_0$ of the peripheral circuit (system impedance) in each frequency band.

A conventional structure of a multiband matching circuit will be described below. The matching circuit is used in amplifiers. The same idea can be applied to matching circuits to be used in other equipment.

In one structure of the multiband matching circuit, switches or variable-capacitance elements are used to change a circuit constant. For example, a matching circuit 300 disclosed in Atsushi Fukuda, et al., "Multi-band Power Amplifier Employing MEMS Switches," the Institute of Electronics, Information and Communication Engineers, General Conference 2004, c-2-4, p. 39, includes a main matching block 310, a delay circuit 321 having one end connected to the main matching block 310, a switch 322, and a sub matching block 323 connected through the switch 322 to the other end of the delay circuit 321, as shown in FIG. 16.

The matching circuit 300 is provided for signals in two frequency bands, and the central frequencies are denoted by $f_1$ and $f_2$, as shown in FIG. 17. When the matching circuit 300 is disposed between a circuit element 20 having $Z_I(f)$ and a port P1 to which a circuit of a system having a predetermined system impedance Z0, such as 50Ω or 75Ω, is connected, the matching circuit 300 is the circuit that establishes matching between $Z_I(f_1)$ and Z0 and between $Z_I(f_2)$ and Z0. The principle of matching will be described below.

If a first frequency band $b_1$ (central frequency $f_1$) is the operating band, the switch 322 is turned off (non conducting state). In this state, the main matching block 310 converts $Z_I(f_1)$ to Z0. If the impedance of the delay circuit 321 in $b_1$ is matched to Z0, the whole matching circuit can achieve matching with respect to signals in $b_1$. The delay circuit 321 shown here as an example is a transmission line having a characteristic impedance Z0 in $b_1$.

If a second frequency band $b_2$ (central frequency $f_2$) is the operating band, the switch 322 is turned on (conducting state). In this state, the main matching block 310 converts $Z_I(f_2)$ to $Z(f_2)$. Generally, $Z(f_2)$ does not equal Z0. No matter what value $Z(f_2)$ is, by specifying the delay amount of the delay circuit 321 (line length, if a transmission line is used) and the reactance value of the sub matching block 323 connected via the switch 322 in accordance with single stub matching scheme, the impedance seen from the terminal P1 to the terminal P2 of the matching circuit 300 can be brought to Z0, because of single stub matching. In other words, the whole matching circuit can establish matching scheme also with respect to signals in $b_2$. As for $Z_L(f)$, matching can be established by the same principle.

The matching circuit 300 implements matching in the two frequency bands by connecting and disconnecting the sub matching block 323 by turning on and off the switch 322. Instead of the series connection of the switch 322 and the sub matching block 323, a reactance element or a reactance circuit may be used. In that case, the same effects as in the case in which the series connection of the switch 322 and the sub matching block 323 is employed can be obtained by appropriately specifying the reactance, so that the reactance is not provided in $b_1$ but provided in $b_2$.

When the multiband matching circuit 300 is connected to an input-output terminal of an amplification device, the multiband matching circuit 300 can serve as a multiband amplifier that operates as an amplifier to signals in $b_1$ when the switch 322 of the matching circuit 300 is in the off state and operates as an amplifier to signals in $b_2$ when the switch 322 is in the on state.

SUMMARY OF THE INVENTION

In the conventional matching circuit 300 that can establish matching of signals in two frequency bands selectively, shown in FIG. 16, the delay circuit 321 and the sub matching block 323 are designed in accordance with the principle of single stub matching scheme on the assumption that the switch 322 is in the on state in $b_2$. In single stub matching scheme, if the impedance conversion ratio |Γ| of an impedance $Z(f_2)$ viewed from points A to P2 in FIG. 16 to Z0 is large, a high current flows into the switch 322. Here, $Z(f_2)$ is a complex number, and |Γ| satisfies the relationship expressed by the equation given below.

$$\frac{Z(f_2) - Z_0}{Z(f_2) + Z_0} = |\Gamma|e^{j\theta}$$

The switch insertion loss is the product of the on resistance of the switch and the square of the current I flowing through the switch. In comparison with a low impedance conversion ratio, a high impedance conversion ratio leads to high transmission loss of the matching circuit. Such deterioration of transmission loss also occurs when a reactance element or a reactance circuit is used instead of the series connection of the switch 322 and the sub matching block 323.

Impedances $Z_I(f_1)$ and $Z_I(f_2)$ of the circuit element 20 in $b_1$ and $b_2$ are determined by a transistor used as an amplification device. The main matching block 310 is designed as a matching circuit in $b_1$. Accordingly, $Z(f_2)$ is almost determined by the transistor, $b_1$, and $b_2$.

An object of the present invention is to provide a low-loss impedance matching circuit that can deal with two or more frequency bands by reducing the amount of current flowing through a switch or a reactance element, thereby reducing the switch insertion loss.

A multiband matching circuit according to the present invention establishes impedance matching between the impedance $Z_I(f)$ of a circuit element having frequency dependence and a predetermined impedance Z0 of a system circuit in first and second frequency bands, and the circuit includes a first matching unit, a second matching unit, and a third matching unit.

The first matching unit is connected at one end to the circuit element and converts the impedance of the circuit element to Z0 in the first frequency band.

The second matching unit includes a first series matching section connected at one end to the other end of the first matching unit, which is a transmission line whose characteristic impedance is equal to the impedance Z0 of the system circuit or a circuit equivalent to the transmission line at least in the first frequency band; and a first parallel matching section connected at one end to the signal path at the other end of the first series matching section and grounded at the other end.

The third matching unit includes a second series matching section connected at one end to the other end of the first series matching section and connected at the other end to the system circuit, which is a transmission line whose characteristic impedance is equal to the impedance $Z_O$ of the system circuit or a circuit equivalent to the transmission line at least in the first frequency band; a switch connected at one end to the signal path at the other end of the second series matching section; and a second parallel matching section connected at one end to the other end of the switch.

The first parallel matching section is configured to be infinite impedance at the connection point to the signal path in the first frequency band.

The first series matching section and the first parallel matching section are designed to make the impedance conversion ratio of the impedance $Z'(f_2)$, which is viewed from the connection point between the second matching unit and the third matching unit to the circuit element, to the impedance Z0 of the system circuit smaller than the impedance conversion ratio of the impedance $Z(f_2)$, which is viewed from the connection point between the first matching unit and the second matching unit to the circuit element, to the impedance Z0 of the system circuit, in the second frequency band, while the switch is in the on state, and the second series matching section and the second parallel matching section are designed to convert the impedance $Z'(f_2)$ to Z0.

The multiband matching circuit matches the impedance of the circuit element with Z0 in the first frequency band and the second frequency band selectively by opening and closing the switch.

EFFECTS OF THE INVENTION

The present invention makes it possible to provide a low-loss matching circuit that performs impedance matching in two or more frequency bands and reduces the amount of current flowing through the switch or the reactance element.

DETAILED DESCRIPTION OF THE PREFERRED EMBODIMENTS

Embodiments of the present invention will be described below in detail.

First Embodiment

Figure 1:
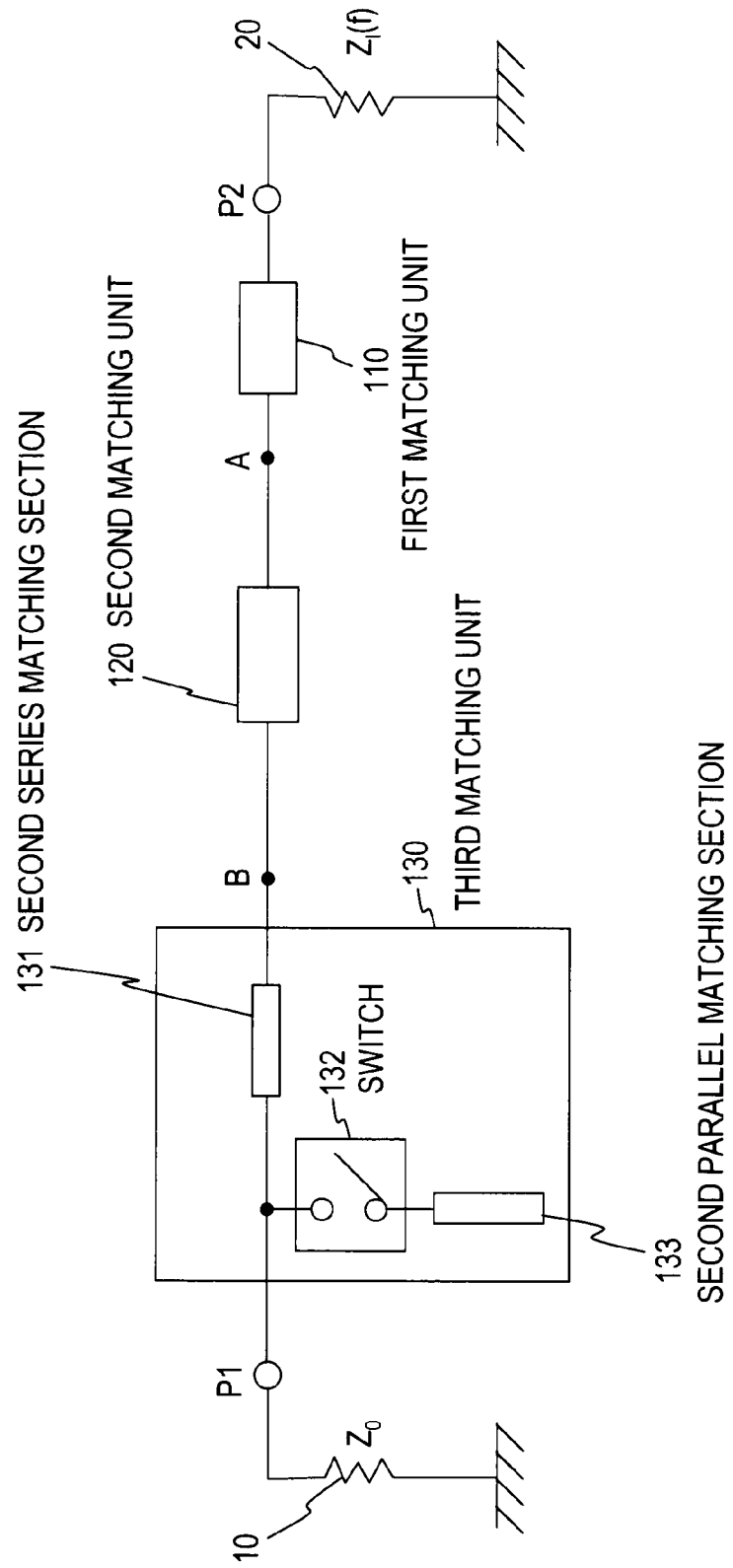
FIG. 1 is a view illustrating a principle by which the amount of current flowing through a switch can be reduced.

Prior to the descriptions of the embodiments, how the amount of current flowing through a switch can be reduced according to the present invention will be described. FIG. 1 shows the basic structure of a matching circuit 1 according to the present invention. The basic structure of the matching circuit 1 includes a first matching unit 110, which corresponds to the main matching block 310 in the matching circuit 300; a third matching unit 130, which corresponds to the combination of the delay circuit 321, the switch 322, and the sub matching block 323 of the matching circuit 300; and a second matching unit 120 placed between the first matching unit 110 and the third matching unit 130. The second matching unit 120 converts $Z(f_2)$ in $b_2$ to impedance $Z'(f_2)$ from point B to P2, without affecting matching in $b_1$. The third matching unit 130 performs matching in $b_2$. Current flowing through a switch 132 in the third matching unit 130 depends on the impedance conversion ratio $|\Gamma'|$ of $Z'(f2)$ to $Z0$. Accordingly, the second matching unit 120 is designed to make $|\Gamma'|<|\Gamma|$. This makes it possible to reduce the amount of current flowing through the switch 132 in comparison with a case in which the second matching unit 120 is not used, so that the loss owing to the on resistance of the switch, that is, the switch insertion loss, can be reduced. It is preferred that the second matching unit 120 be an element having a small resistance component including a parasitic component, such as a line, an inductor, or a capacitor. It is generally difficult to implement a switch that has both low insertion loss and high isolation characteristics. According to the present invention, however, because the amount of current flowing through the switch is reduced, the insertion loss requirement of the switch can be eased, the switch can have high isolation characteristics.

A matching circuit 100, which is an embodiment of the second matching unit 120 of the matching circuit 1, will be below described with reference to FIG. 2.

The matching circuit 100 handles signals in two frequency bands. The matching circuit is placed between a circuit element 20 having $Z_f(f_1)$ and $Z_f(f_2)$ and a system circuit 10 having Z0, to match $Z_f(f_1)$ and $Z_f(f_2)$ with Z0. When the sections and blocks are designed, it is assumed that the switch 132 is in the off state in $b_1$ and in the on state in $b_2$.

The matching circuit 100 includes the first matching unit 110, the second matching unit 120, and the third matching unit 130, as described earlier. The second matching unit 120 includes a first series matching section 121 and a first parallel matching section 122. The third matching unit 130 includes a second series matching section 131, the switch 132, and a second parallel matching section 133.

The first matching unit 110 has one end connected to the circuit element 20 and converts the impedance $Z_f(f_1)$ of the circuit element 20 in $b_1$ to Z0 when viewed from the other end (point A in FIG. 1) to P2. The first matching unit 110 can have any structure, such as a structure formed of a transmission line and a stub or a structure formed of a series inductor and a parallel capacitor. Here, the impedance $Z_f(f_2)$ of the circuit element 20 in $b_2$ is converted to $Z(f_2)$.

The other end of the first matching unit 110 is connected to one end of the first series matching section 121, and the other end of the first series matching section 121 is connected to one end of the second series matching section 131. The other end of the second series matching section 131 is connected to the system circuit 10.

Figure 18A:
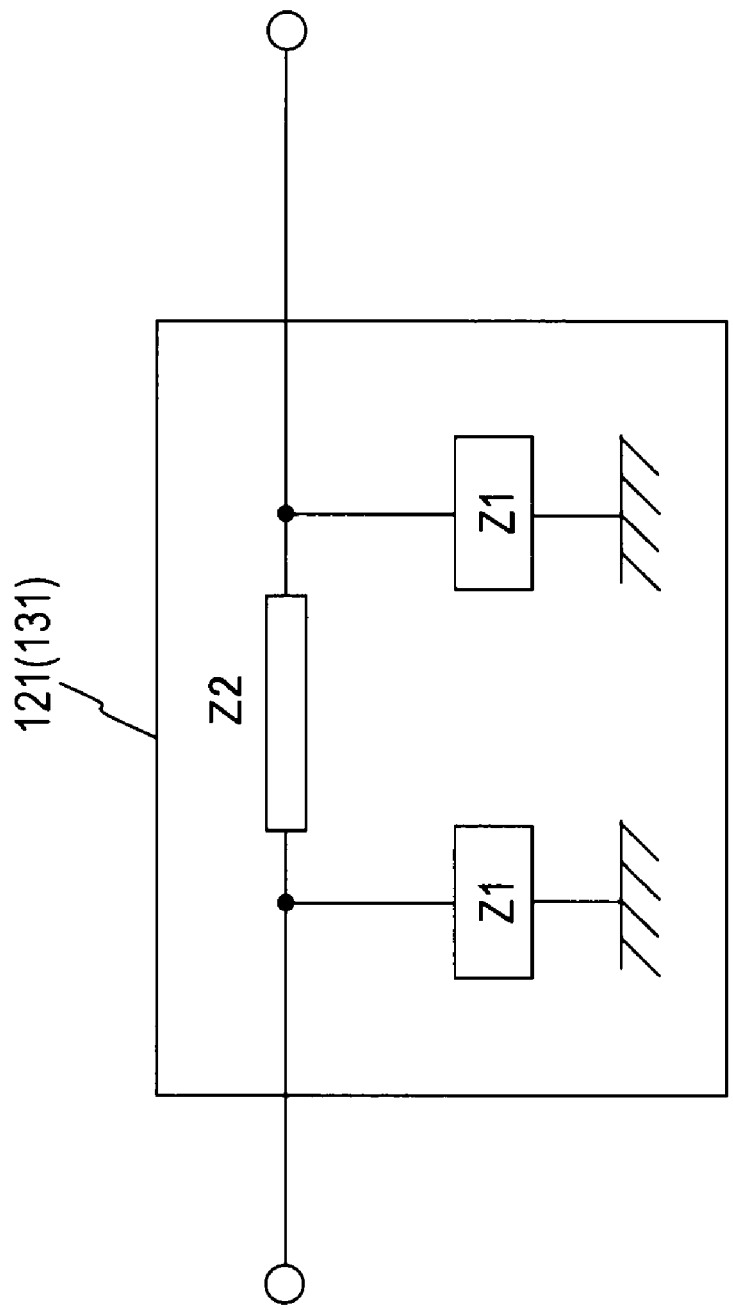
FIG. 18A shows the structure of a circuit equivalent to a transmission line whose characteristic impedance is Z0 at least in $b_1$.
Figure 18B:
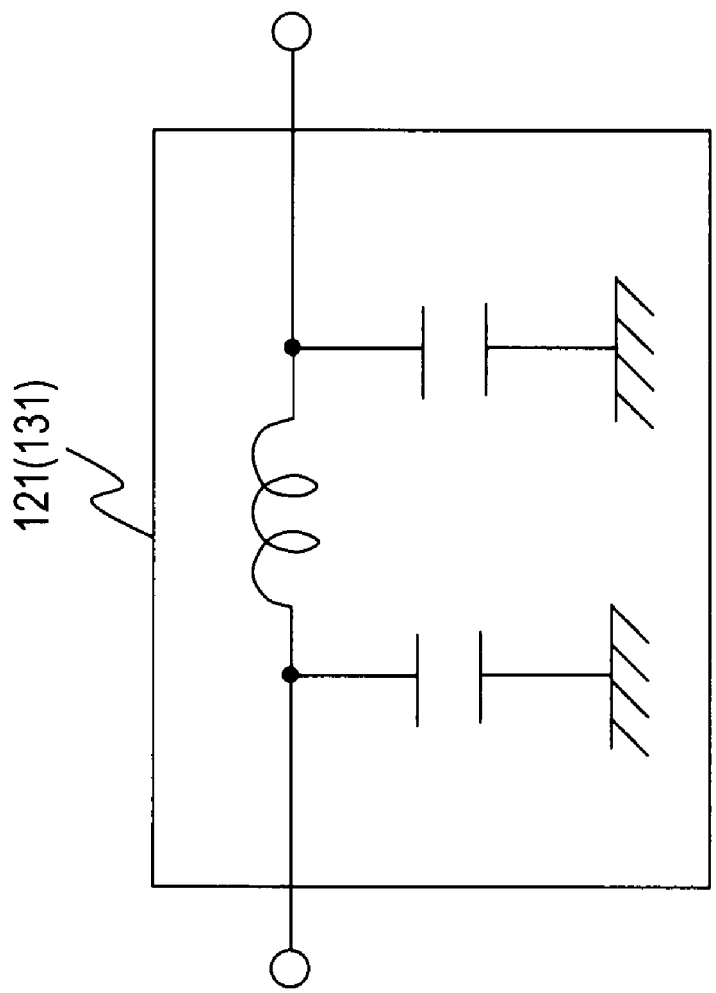
FIG. 18B shows a specific structure of that shown in FIG. 18A.
Figure 18C:
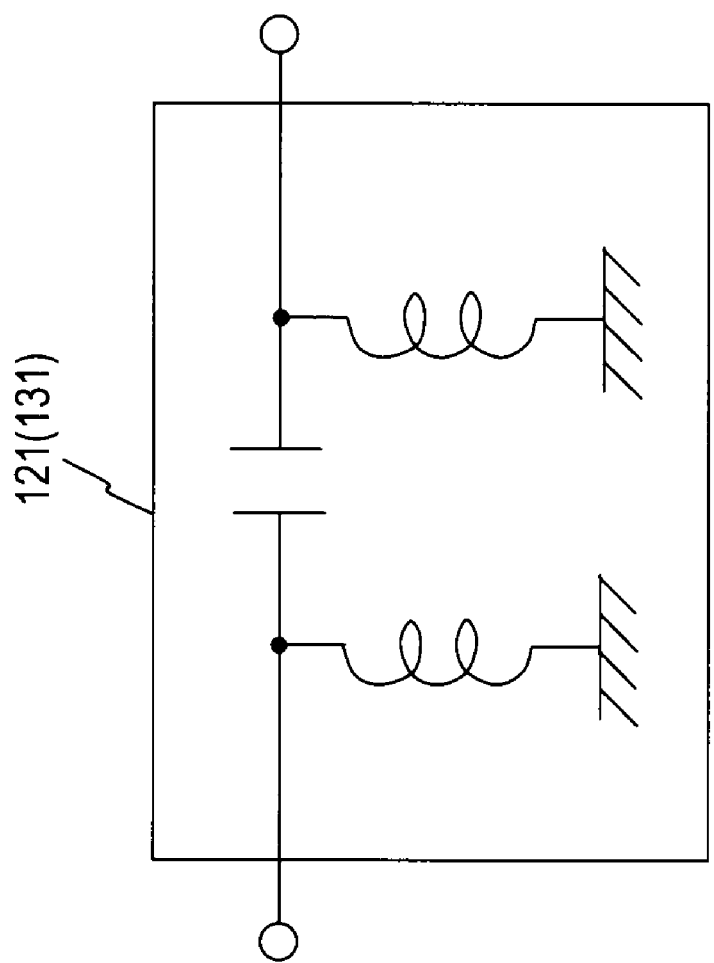
FIG. 18C shows another specific structure of that shown in FIG. 18A.
Figure 19A:
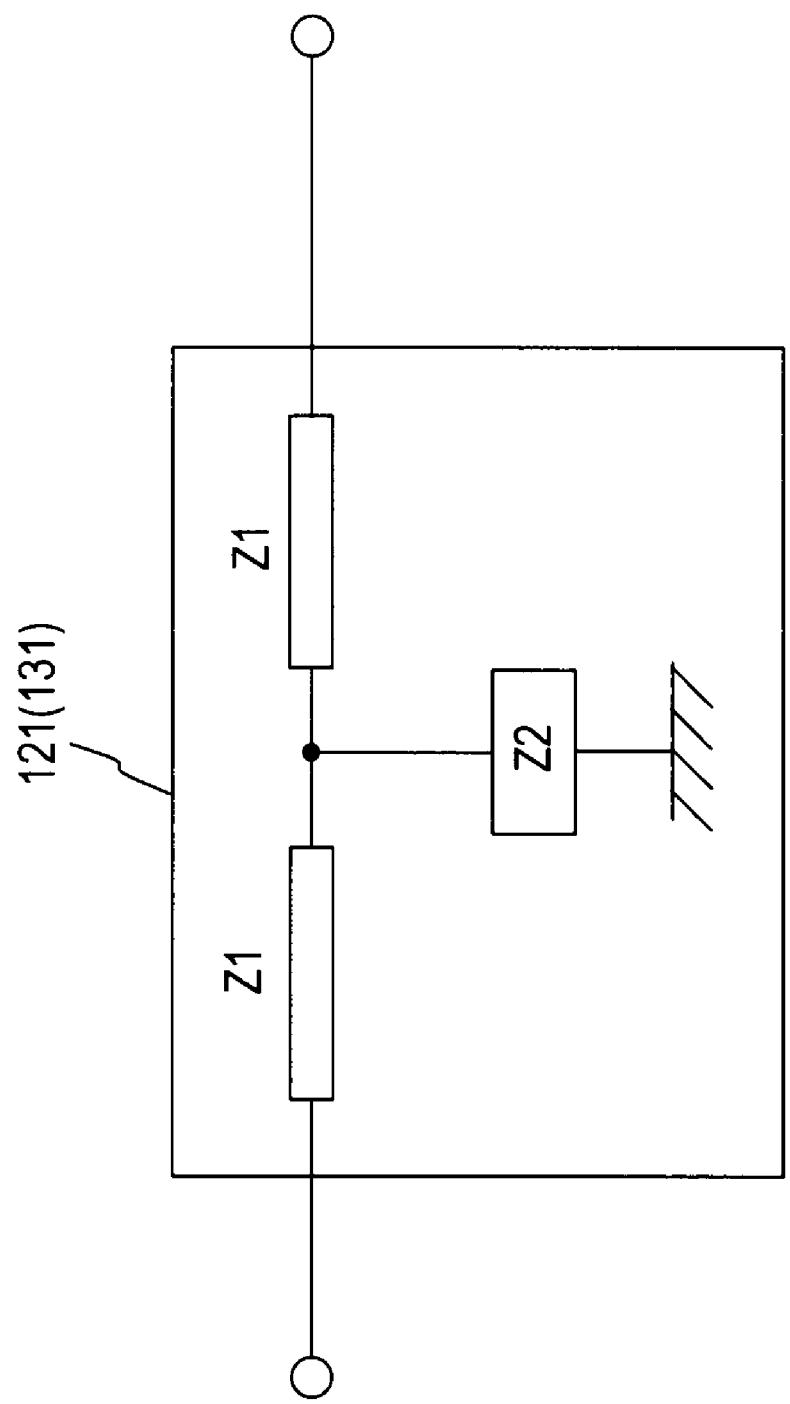
FIG. 19A shows another structure of the circuit equivalent to the transmission line whose characteristic impedance is Z0 at least in $b_1$.
Figure 19B:
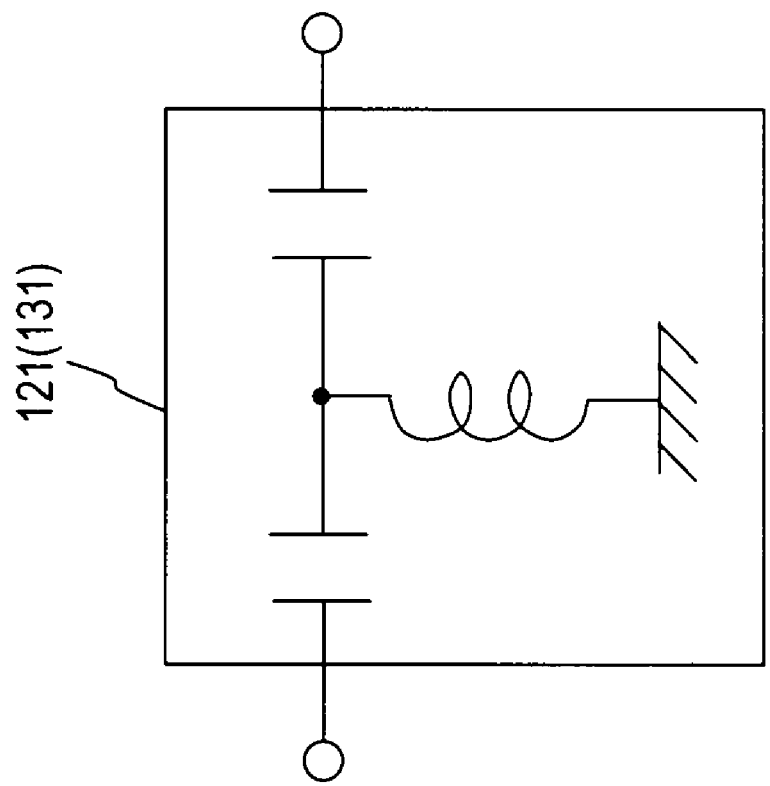
FIG. 19B shows a specific structure of that shown in FIG. 19A.
Figure 19C:
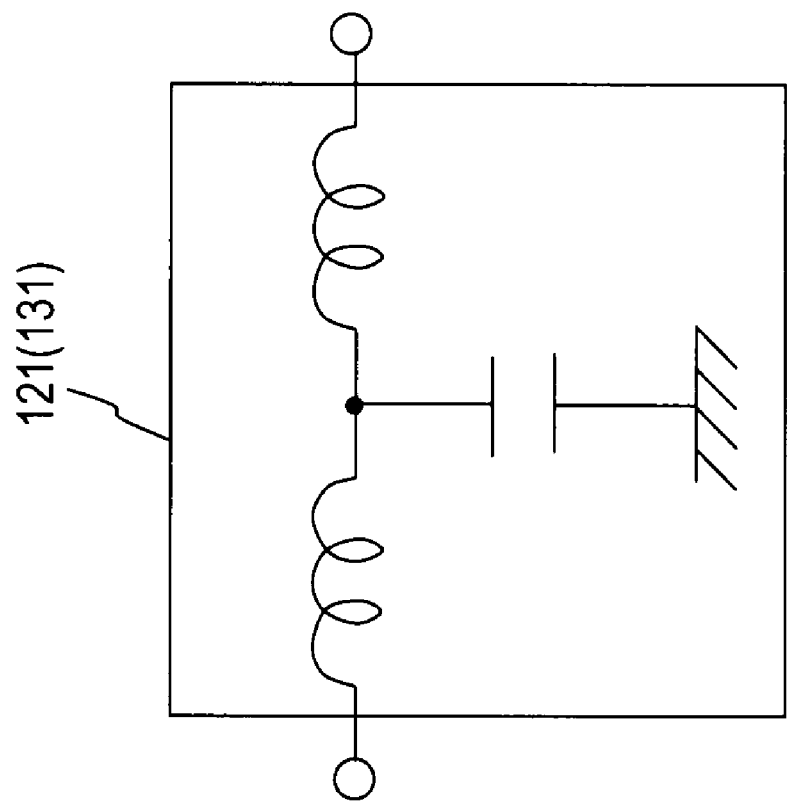
FIG. 19C shows another specific structure of that shown in FIG. 19A.

The first series matching section 121 and the second series matching section 131 are formed of a transmission line whose characteristic impedance is Z0 or a delay circuit equivalent to the transmission line at least in $b_1$. FIGS. 18A and 19A show example structures of a delay circuit equivalent to the transmission line at least in $b_1$. Here, $Z_1$ and $Z_2$ are pure imaginary numbers. If $Z_1$ and $Z_2$ in $b_1$ have the relationship expressed as $$Z_2 = \frac{2Z_0^2 Z_1}{(Z_1^2 - Z_0^2)} \quad (1)$$

in FIG. 18A or the relationship expressed as $$Z_2 = \frac{Z_0^2 - Z_1^2}{2Z_1} \quad (2)$$

in FIG. 19A, the circuit does not affect matching in $b_1$. With the structure shown in FIG. 18A or 19A, the matching state in $b_1$ established by the first matching unit 110 is maintained irrespective of the delay amount of the delay circuit. Just the relationship between $Z_1$ and $Z_2$ is specified here, and the actual structure, such as inductors and capacitors, or a distributed constant circuit or a group of circuit elements having characteristics similar to the inductors and capacitors, can be selected appropriately. Therefore, the characteristic value of each element can be specified to establish impedance matching in $b_2$. If the first series matching section 121 and the second series matching section 131 are formed of delay circuits such as transmission lines, matching is maintained in $b_1$ irrespective of the delay amount. Therefore, the delay amount caused by the transmission lines can be specified in a desired manner. The delay amount can be specified to such a value that impedance matching in $b_2$ is established. A part of the delay amount that is originally required for matching in $b_2$ can be met by the delay amount of the first series matching section 121. Consequently, the delay amount of the second series matching section 131 can be reduced, and the second series matching section 131 can be reduced in size. Specific examples of the structure shown in FIG. 18A are illustrated in FIGS. 18B and 18C. Specific examples of the structure shown in FIG. 19A are also illustrated in FIGS. 19B and 19C. The same effects can be obtained when the structures illustrated in FIGS. 18B and 18C are connected in series or a circuit equivalent to the series connection is used, or when the structures illustrated in FIGS. 19B and 19C are connected in series or a circuit equivalent to the series connection is used.

The first matching unit 110, the first series matching section 121, and the second series matching section 131 are disposed in series in a signal path connecting the system circuit 10 and the circuit element 20. The first parallel matching section 122 and the second parallel matching section 133 are branched from the signal path and disposed in parallel with the system circuit 10 and the circuit element 20.

The first parallel matching section 122 is connected at one end to the signal path at the other end of the first series matching section 121 connected to one end of the second series matching section 131, and grounded at the other end. To establish impedance matching in $b_2$, the first parallel matching section 122 fulfils a function of specifying an appropriate reactance value to adjust the impedance. The first parallel matching section 122, however, should not affect the impedance Z0 in $b_1$ converted from $Z_f(f_1)$ by the first matching unit 110. The first parallel matching section 122 has two blocks connected in series, so that the function and requirements described above are met. A first parallel block 122a functions as a switch for isolating the first parallel matching section 122 from the signal path in $b_1$. A second parallel block 122b is provided to specify an appropriate reactance value for impedance conversion in $b_2$. The second parallel block 122b may be provided as a capacitive reactance block using an open-end line.

Figure 20:
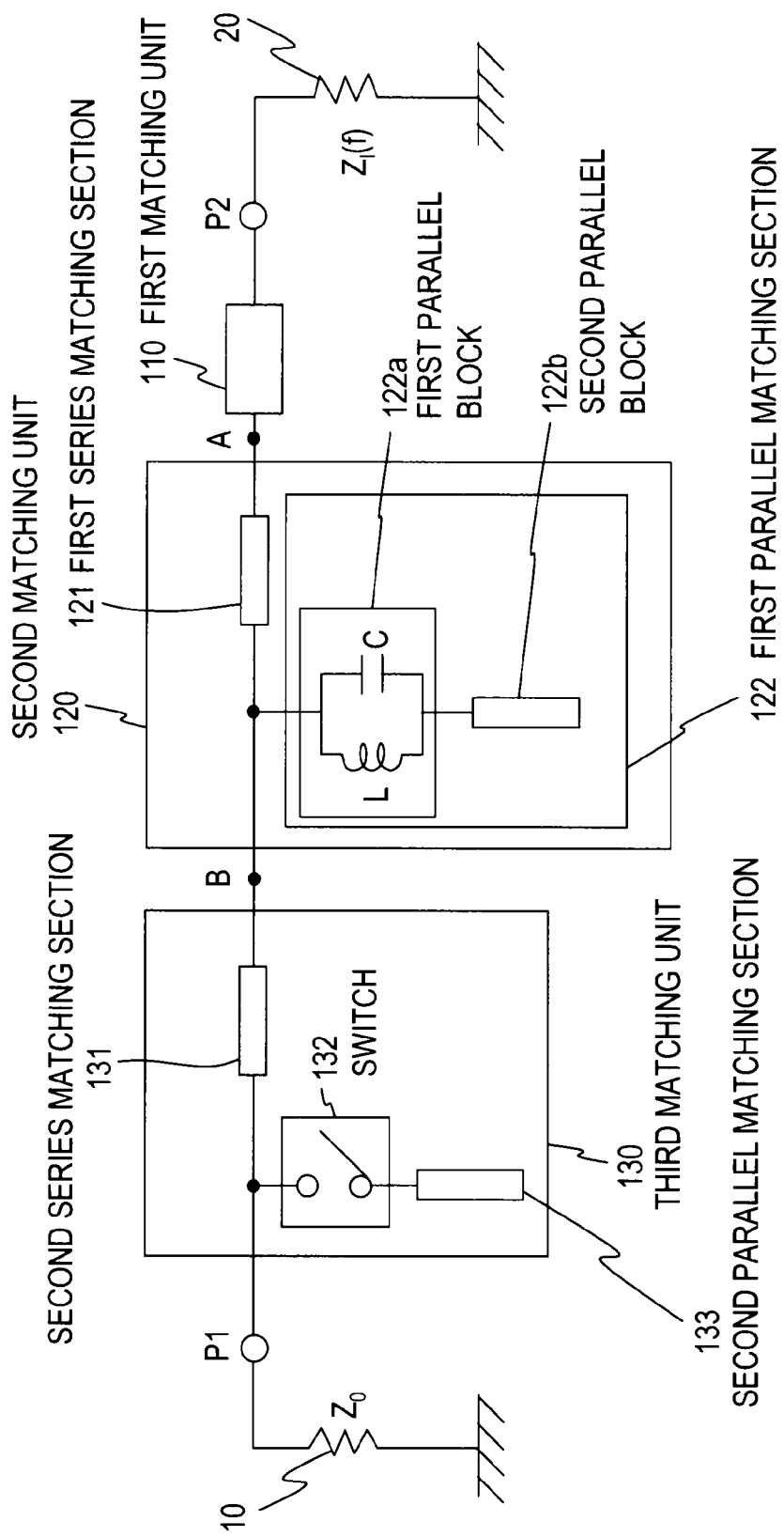
FIG. 20 shows a structure in which a parallel resonance circuit is employed as a first parallel block in the first embodiment.

The first parallel block 122a is configured to open in impedance the connection point to the signal path in $b_1$ (the impedance viewed from the connection point to the first parallel matching section 122 is infinite or is so large that matching in $b_1$ is not affected). This functions like a physical switch that is kept in the off state in $b_1$, isolating the first parallel matching section 122 from the circuit. If the first parallel block 122a does not have a resistance component such as the on resistance of a switch, the amount of current flowing there does not cause loss. The open state in impedance in $b_1$ can be produced by forming the first parallel block 122a of a parallel resonance circuit (resonance frequency $f_1$) made by a capacitor having capacitance C and an inductor having inductance L, for example. Any other configuration is possible so long as it satisfies the condition that the impedance in $b_1$ viewed from the connection point of the signal path to the first parallel matching section 122 is infinite. FIG. 20 is a block diagram of a structure having a parallel resonance circuit as the first parallel block 122a and an open-end line as the second parallel block 122b. When the first parallel block 122a is a parallel resonance circuit, the relationship among $f_1$, C, and L is expressed by the following equation.

$$f_1 = \frac{1}{2\pi\sqrt{LC}} \quad (3)$$

Here, the first parallel matching section 122 is presented as a specific reactance in $b_2$, and the combination of the first parallel block 122a and the second parallel block 122b integrally forms the first parallel matching section 122. The first parallel matching section 122 has a function of setting a reactance value for impedance conversion in $b_2$, together with the first series matching section 121. If the first parallel block 122a is a parallel resonance circuit, the reactance $Z_{LC}$ of the first parallel block 122a at $f_2$ is expressed as follows.

$$Z_{LC} = \frac{j2\pi f_2 L}{1 - 2\pi f_2 LC} \quad (4)$$

Figure 21:
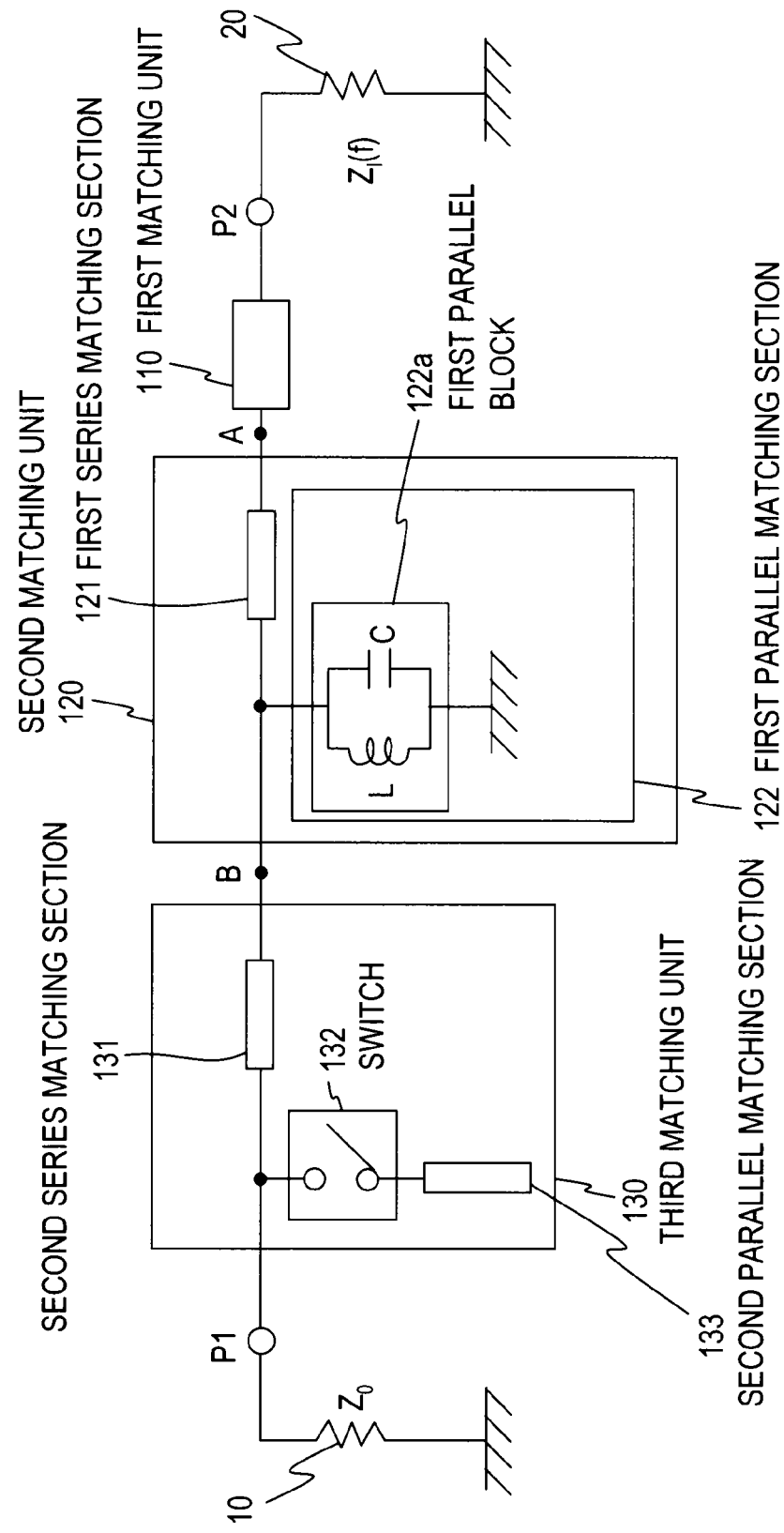
FIG. 21 shows another structure in which a parallel resonance circuit is employed as the first parallel block in the first embodiment.

Therefore, by specifying C and L in such a manner that equation (3) holds if the first parallel block 122a is a parallel resonance circuit and that $Z_{LC}$ in equation (4) becomes the reactance required for impedance matching in $b_2$, the need for the second parallel block 122b is eliminated, and the first parallel matching section 122 can be formed just of the first parallel block 122a, as shown in FIG. 21.

Figure 22:
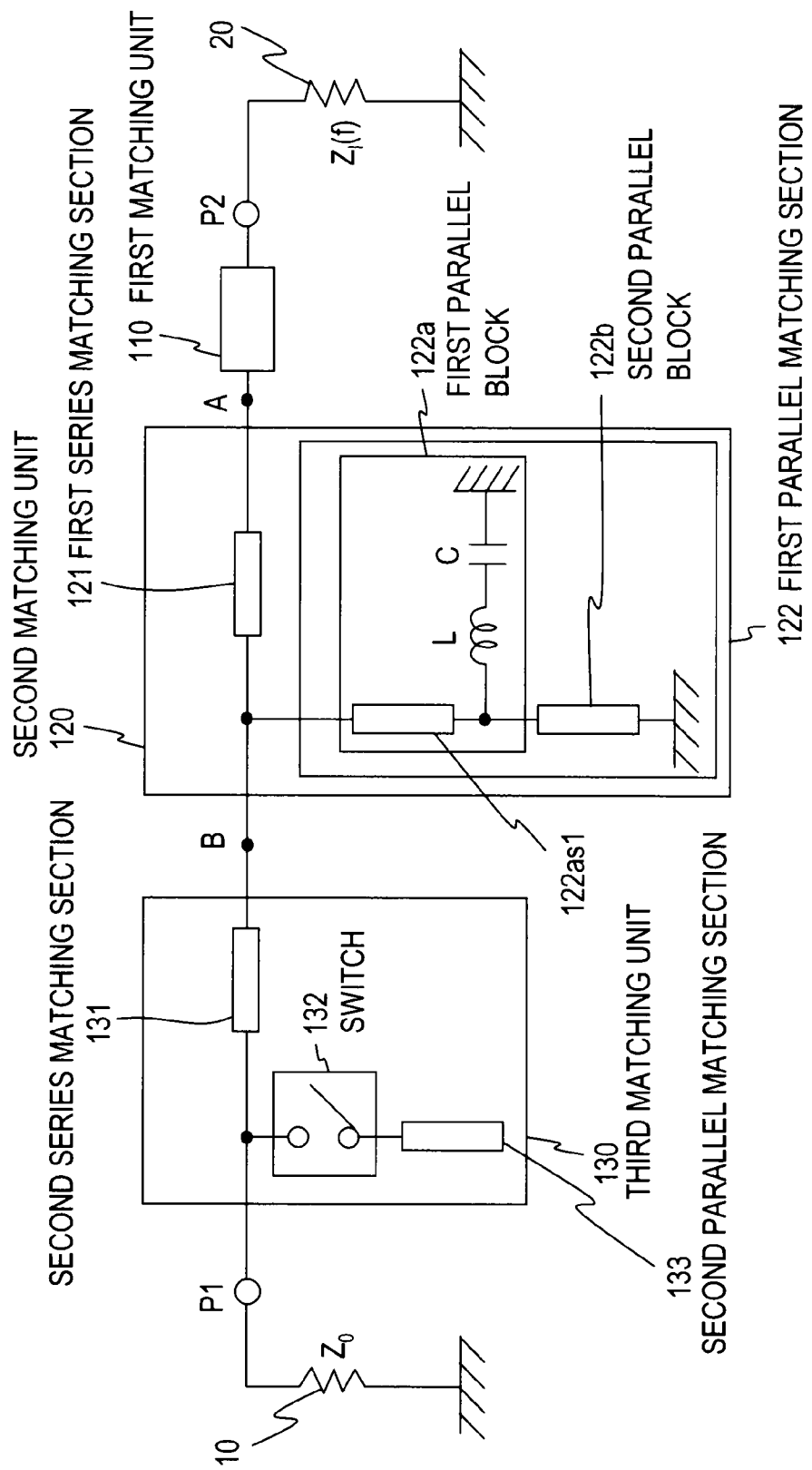
FIG. 22 shows a structure in which a series resonance circuit is employed as the first parallel block in the first embodiment.

The first parallel block 122a can also be formed by a combination of a transmission line 122as1 having a length equal to a quarter of the wavelength $\lambda_1$ at $f_1$ and a series resonator formed of L and C and having a resonance frequency $f_1$, as shown in FIG. 22. In this structure, the transmission line 122as1 is short-circuited in impedance in $b_1$ at one end connected to the series resonator, opening in impedance in $b_1$ the other end of the transmission line 122as1, regardless of the structure of the second parallel block 122b. Therefore, it can be considered that the first parallel matching section 122 is isolated from the circuit in $b_1$. The series resonator is present as a specific reactance in $b_2$. As a result, the combination of the first parallel block 122a and the second parallel block 122b integrally forms the first parallel matching section 122 and is present as a specific reactance. The first parallel matching section 122 has a function of setting a reactance value for impedance conversion in $b_2$, together with the first series matching section 121.

Figure 2:
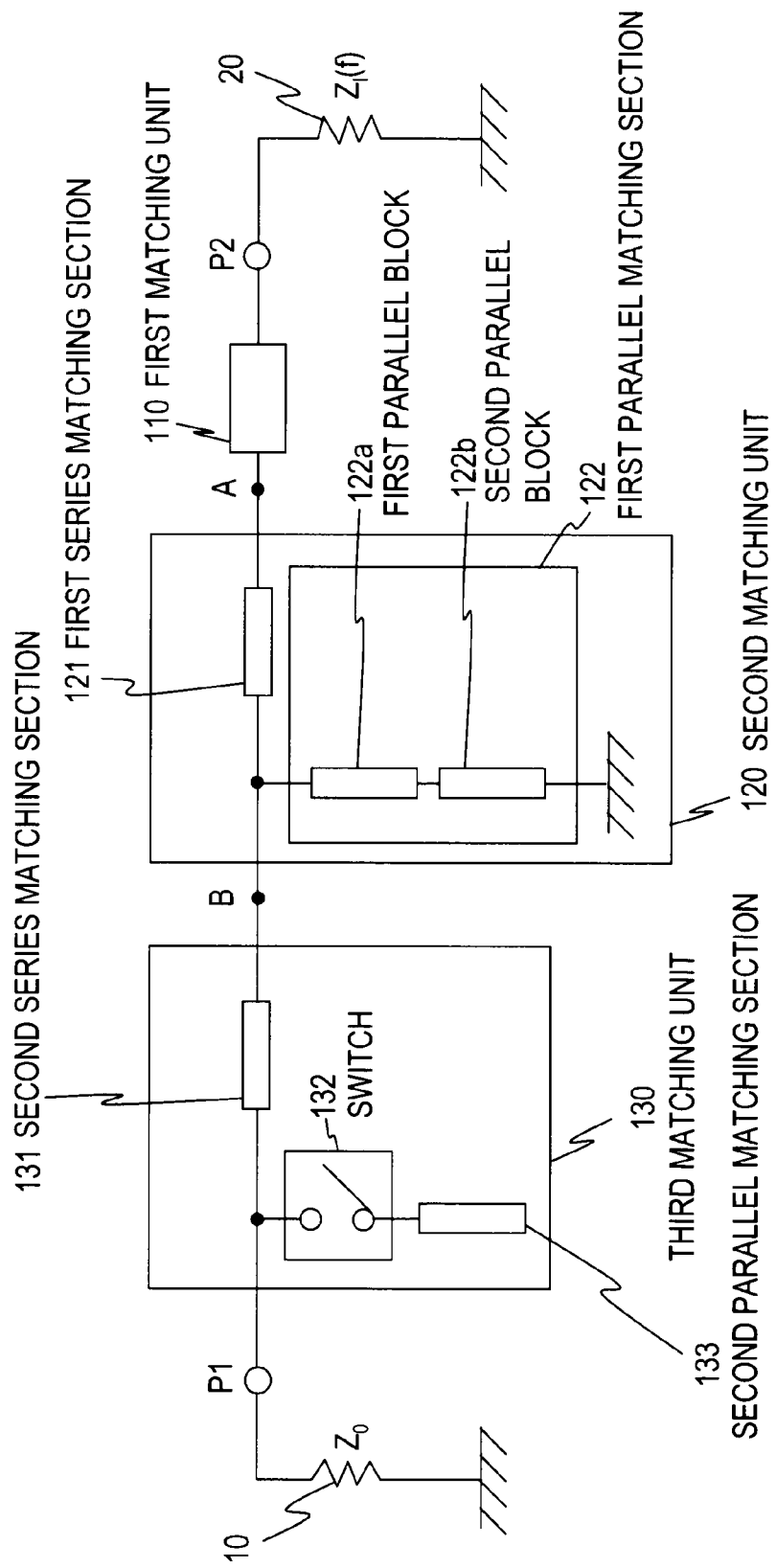
FIG. 2 is a functional block diagram of a first embodiment.

In FIG. 2, the first parallel block 122a is placed on the signal path side, and the second parallel block 122b is placed on the ground side. The positions of the first parallel block 122a and the second parallel block 122b can be exchanged. With the exchanged positions, however, an open portion in impedance occurs at the connection point between the two blocks, so that the second parallel block 122b, connected to the signal path, affects the impedance matching state in $b_1$. In such a case, the influence can be reduced by using a lumped constant element as the second parallel block 122b. Then, the connection point to the signal path can be regarded as an open state in impedance in $b_1$, and it can be considered that the first parallel matching section 122 is isolated from the signal path in $b_1$. When the first parallel block 122a is on the ground side, the open state in impedance can be created also by using a transmission line having a length equal to a quarter of the wavelength at $f_1$ as the first parallel block 122a. That transmission line can have any impedance, and the impedance may be used as a design parameter for impedance conversion in $b_2$.

The second parallel matching section 133 is connected through the switch 132 to the signal path at the other end of the second series matching section 131 and has a function of specifying appropriate reactance for matching in $b_2$ to adjust the impedance, in the same manner as the first parallel matching section 122 does.

In this structure, the impedance $Z(f_2)$ at point A in $b_2$ is converted to Z0 by the second matching unit 120 and the third matching unit 130, without affecting matching in $b_1$. To be more specific, the first series matching section 121 and the first parallel matching section 122 are designed without an element having a parasitic resistance component, such as a switch, in order that |Γ'| in $b_2$ becomes smaller than |Γ|. By considering that the switch 132 is in the on state and specifying the second series matching section 131 and the second parallel matching section 133 in the third matching unit 130 appropriately with respect to Z'(f2), any impedance value of Z'(f2) at P1 can be matched with Z0.

With the matching units configured as described above, impedance matching between $Z_f(f_1)$ of the circuit element 20 and Z0 of the system circuit 10 can be established in $b_1$ when the switch 132 is in the off state. When the switch 132 is in the on state, impedance matching between $Z_f(f_2)$ of the circuit element 20 and Z0 of the system circuit 10 can be established in $b_2$. In addition, high-frequency current flowing through the switch 132 can be reduced in comparison with when the second matching unit 120 is not provided, so that a low-loss multiband matching circuit can be implemented with loss caused by the on resistance being reduced.

Each of the components, sections, and blocks included in the matching circuit 100 can be a single transmission line, a single element, a combination of them, a plurality of transmission lines, a plurality of elements, or a combination of them, if the corresponding function can be fulfilled. The element can be a linear element such as a resistor (or a variable resistor), a capacitor (or a variable capacitor), or an inductor (or a variable inductor), a non-linear two-terminal element such as a diode, or the like. The element that can be used here is not restricted.

It does not matter whether $b_1$ or $b_2$ is greater, but it is preferable that $f_1$ be greater than $f_2$. The reasons for this include the following: A sufficient bandwidth can be easily kept with that configuration; because the loss of the switch (equivalent resistance) generally increases with an increase in frequency, the loss can be reduced by setting the frequency ($f_2$) at which matching is achieved in the on state, to a lower frequency; and if the second parallel block 122b is a line having a length equal to a quarter of the wavelength, the length of the line can be reduced by using the higher frequency as $f_1$.

In the description given above, impedance conversion from $Z_f(f_1)$ to Z0 (bringing the impedance from points A to P2 to Z0) is established by the first matching unit 110 alone. However, the object of the present invention can be achieved while Γ>Γ' is satisfied in $b_2$, even if impedance conversion to Z0 in $b_1$ is performed (bringing the impedance from points B to P2 to Z0) by the first matching unit 110 and the second matching unit 120 (the second matching unit 120 can have any structure). The same applies to the embodiments described below. For convenience of explanation, however, the first matching unit 110 alone converts $Z_f(f_1)$ to Z0 in the description given below.

Second Embodiment

Figure 3:
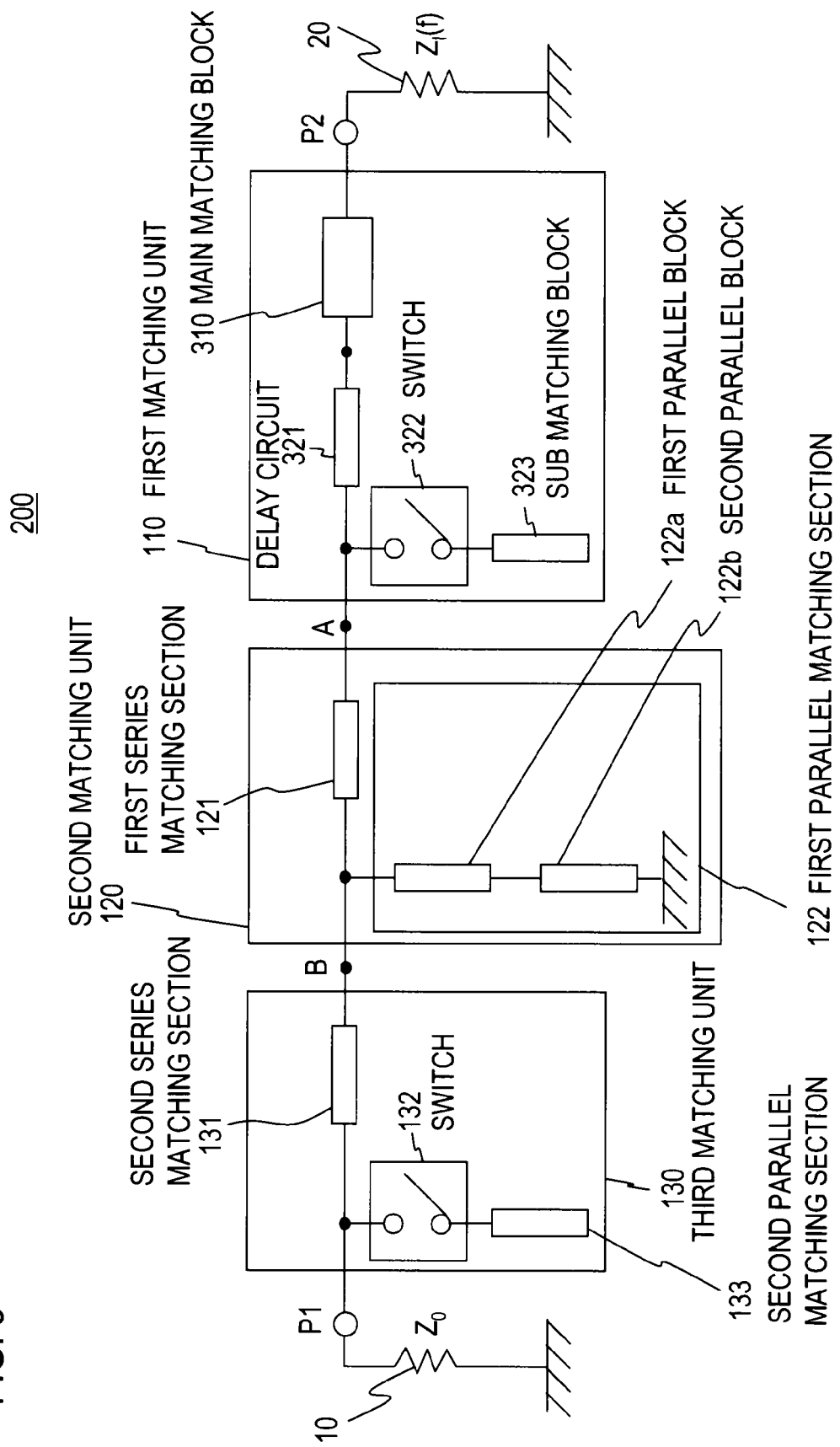
FIG. 3 is a functional block diagram of a second embodiment.

FIG. 3 shows a matching circuit 200 according to a second embodiment. The matching circuit 200 differs from the matching circuit 100 in the first embodiment shown in FIG. 2 in that the matching circuit 300 described as an example of the related art is used as the first matching unit 110. The first matching unit 110 converts impedance $Z_f(f_1)$ in $b_1$ or $Z_f(f_2)$ in $b_2$ of the circuit element 20 to Z0, as selected by switching the switch 322. When the switch 322 is in the off state, the impedance from points A to P2 in FIG. 3 in $b_1$ is converted to Z0, and when the switch 322 is in the on state, the impedance in $b_2$ is converted to $Z0_O$. When the switch 132 is in the off state, the matching state (impedance Z0) established by the first matching unit 110 in $b_1$ or $b_2$ in accordance with the state of the switch 322 is maintained even through the second and third matching units, and the whole matching circuit can establish matching in $b_1$ or $b_2$.

Figure 4:
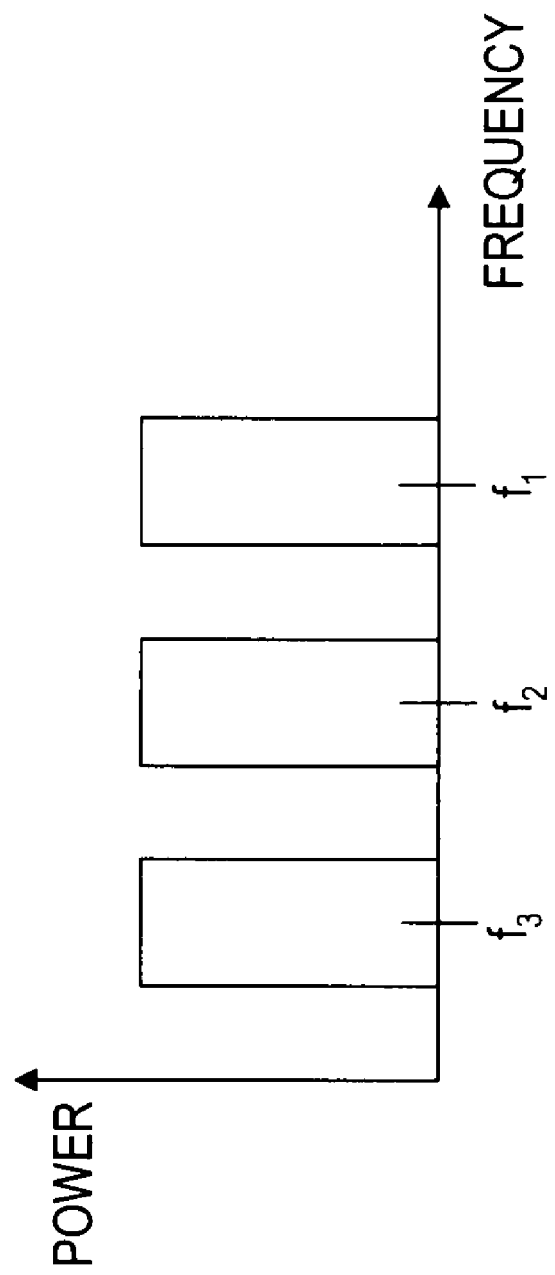
FIG. 4 is a view illustrating the relationship among three frequency bands.

In a third frequency band $b_3$ (central frequency $f_3$), as shown in FIG. 4, the impedance $Z_f(f_3)$ of the circuit element 20 is converted by the first matching unit 110, and the impedance from points A to P2 becomes $Z(f_3)$ (the state of the switch 322 of the first matching unit 110 is set to be on or off in advance). The impedance $Z(f_3)$ in $b_3$ is converted in stages to Z0 by the second matching unit 120 and the third matching unit 130, as in the first embodiment, without affecting matching in $b_1$ and $b_2$. To be more specific, the first series matching section 121 and the first parallel matching section 122 are designed without an element having a parasitic resistance component, such as a switch, in order that the conversion ratio |Γ'| from the impedance Z'($f_3$) viewed from points B to P2 to Z0 becomes smaller than the conversion ratio |Γ| from the impedance Z($f_3$) viewed from points A to P2 to Z0 in $b_3$. Then, by designing the second series matching section 131 and the second parallel matching section 133 of the third matching unit 130 with respect to Z'($f_3$), considering that the switch 132 is in the on state, the impedance at P1 can be matched with Z0 in $b_3$.

In the matching circuit 200, the first series matching section 121 and the second series matching section 131 are formed of a transmission line whose characteristic impedance is Z0 or a delay circuit equivalent to the transmission line in at least $b_1$ and $b_2$. With this configuration, the matching state in $b_1$ and $b_2$ established by the first matching unit 110 is maintained regardless of the structure of the delay circuit. Accordingly, the characteristics of the circuits can be specified appropriately to establish matching in $b_3$. Example delay circuits formed of a circuit equivalent to the transmission line at least in $b_1$ and $b_2$ are illustrated in FIGS. 23A and 24A.

Figure 23A:
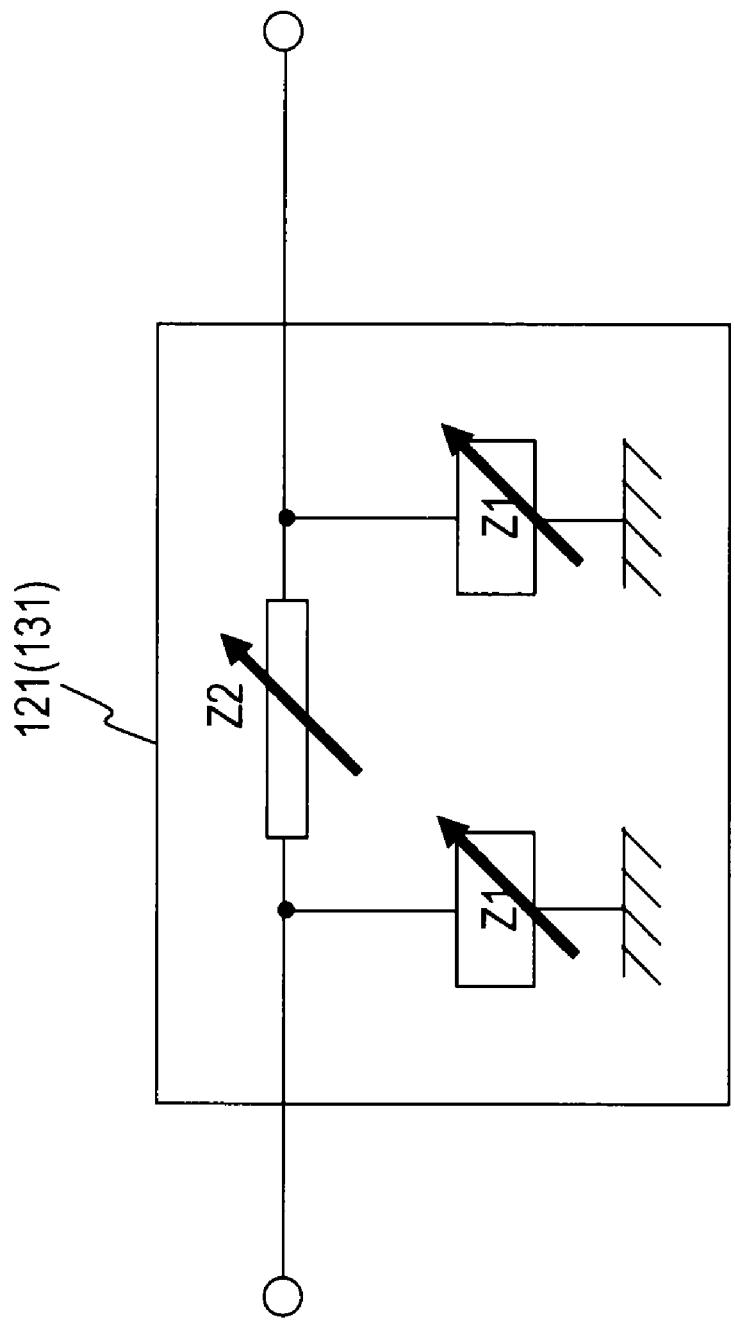
FIG. 23A shows the structure of a circuit equivalent to a transmission line whose characteristic impedance is Z0 at least in $b_1$ and $b_2$.
Figure 23B:
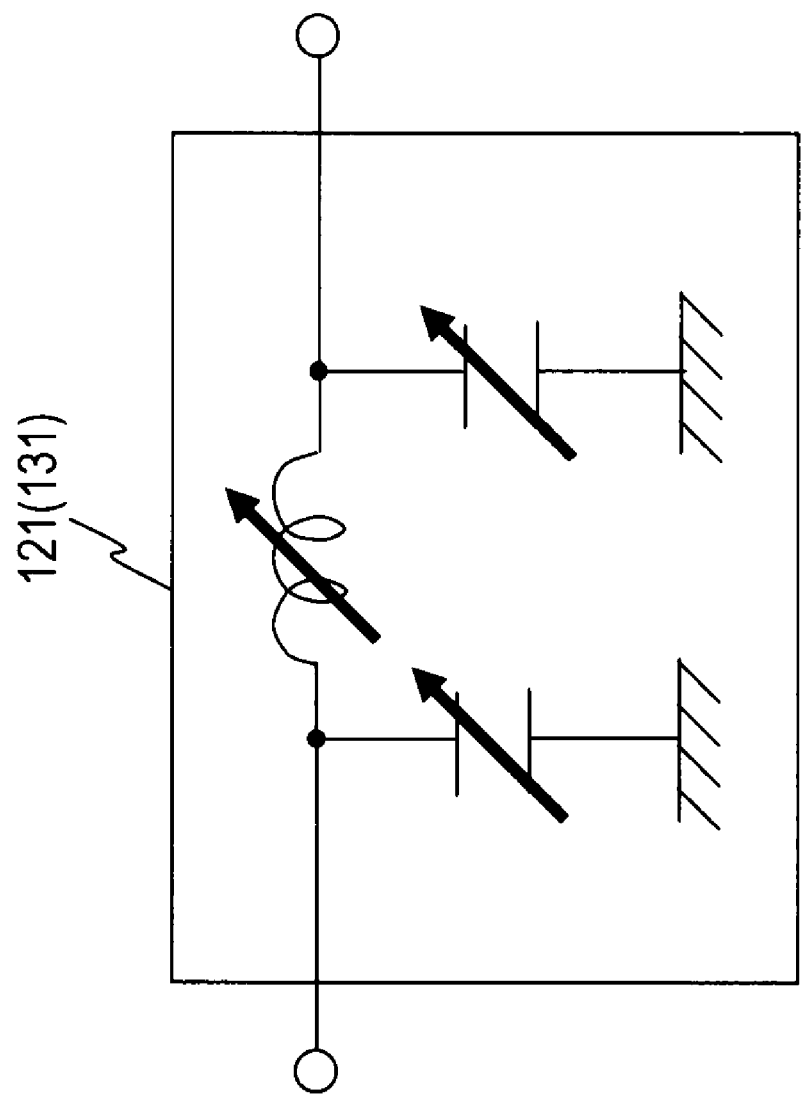
FIG. 23B shows a specific structure of that shown in FIG. 23A.
Figure 23C:
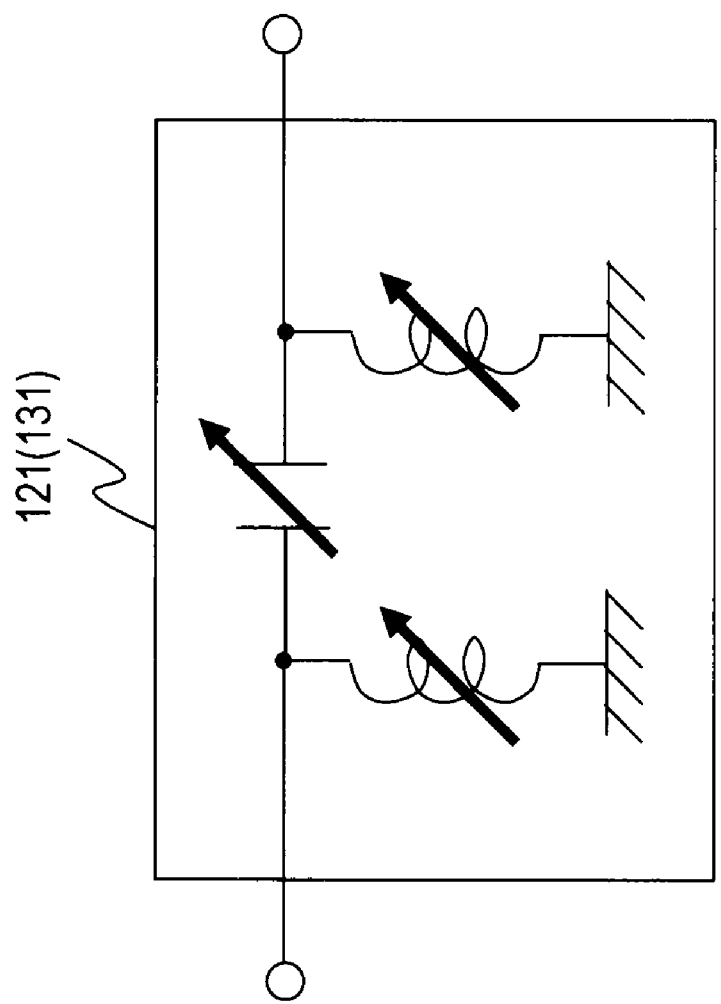
FIG. 23C shows another specific structure of that shown in FIG. 23A.
Figure 24A:
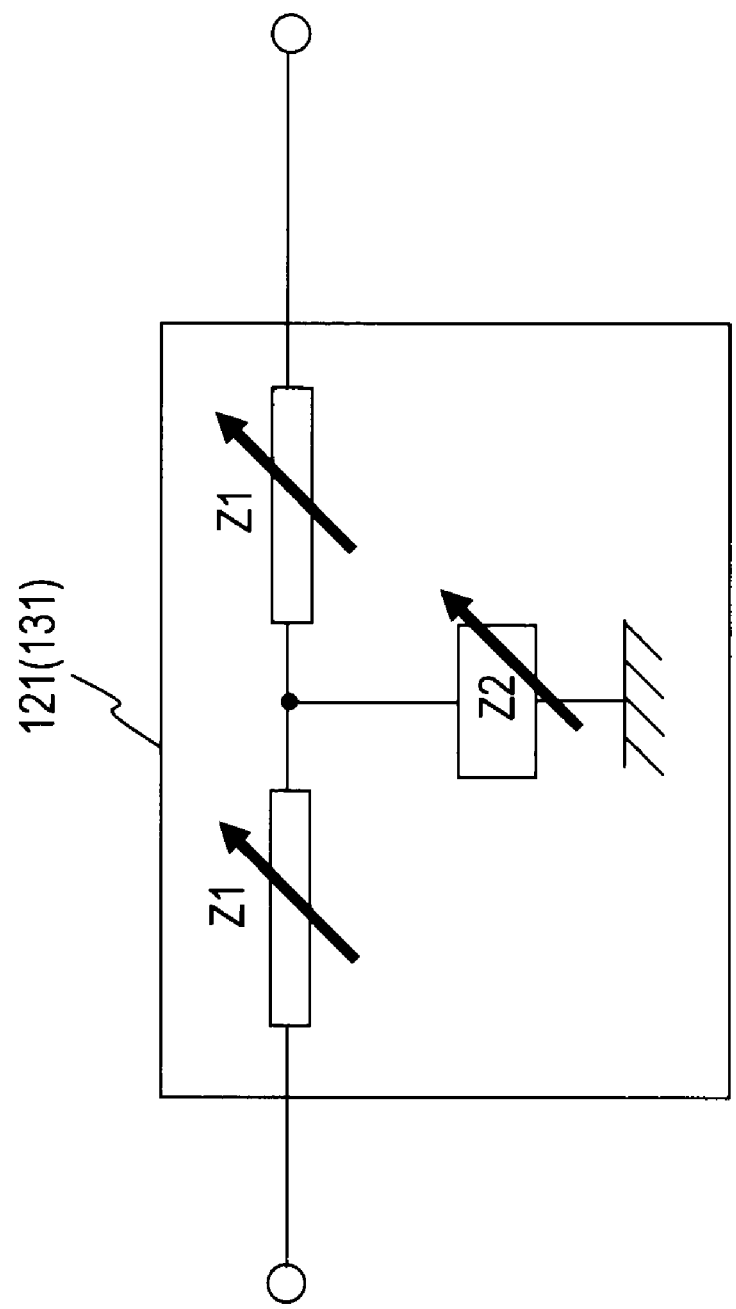
FIG. 24A shows another structure of the circuit equivalent to the transmission line whose characteristic impedance is Z0 at least in $b_1$ and $b_2$.
Figure 24B:
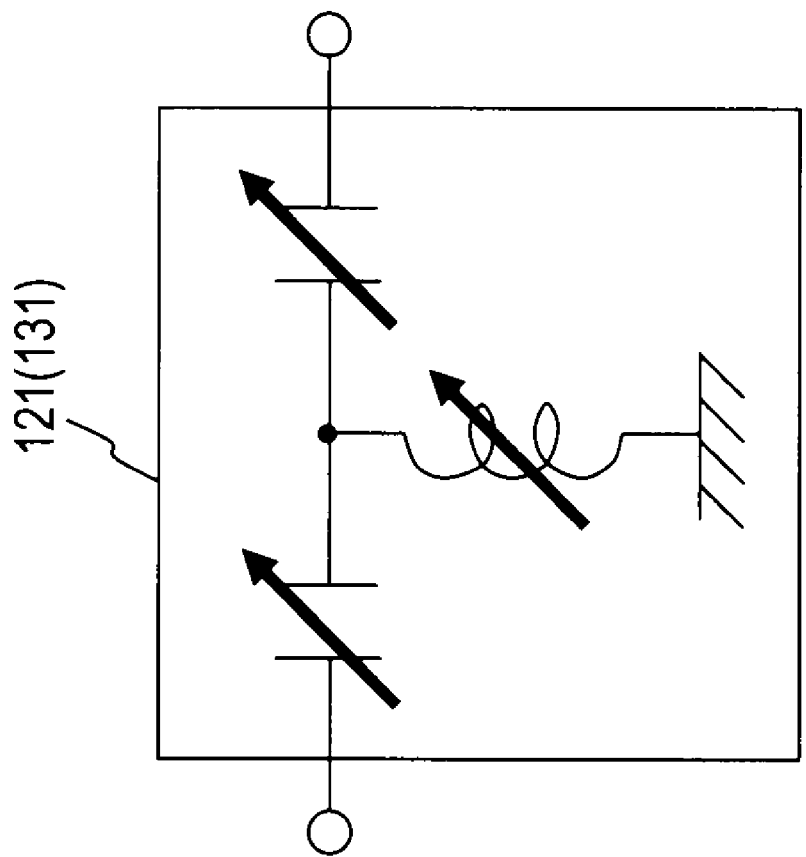
FIG. 24B shows a specific structure of that shown in FIG. 24A.
Figure 24C:
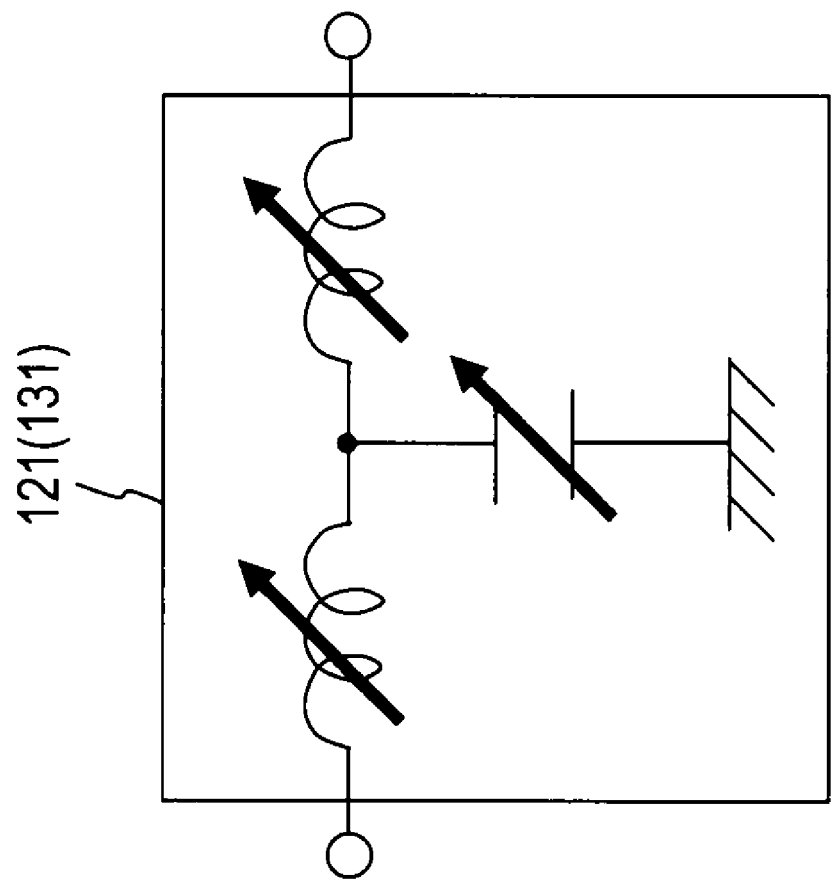
FIG. 24C shows another specific structure of that shown in FIG. 24A.
Figure 25A:
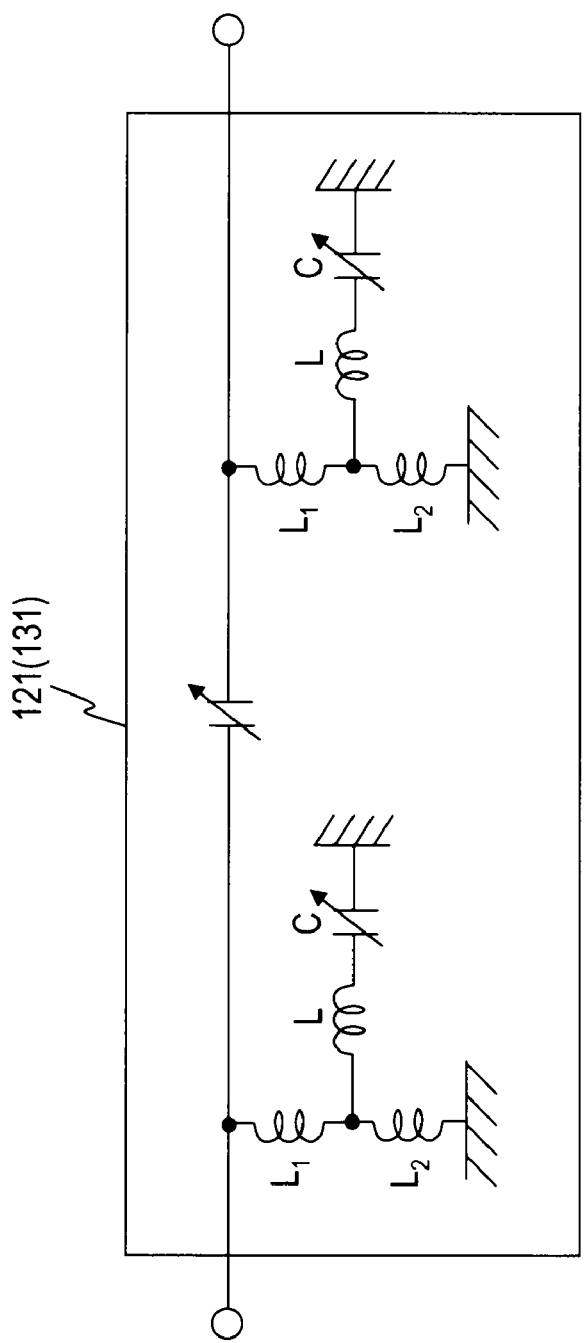
FIG. 25A shows a structure in which variable inductors shown in FIG. 23C are replaced with variable capacitors and other elements.
Figure 25B:
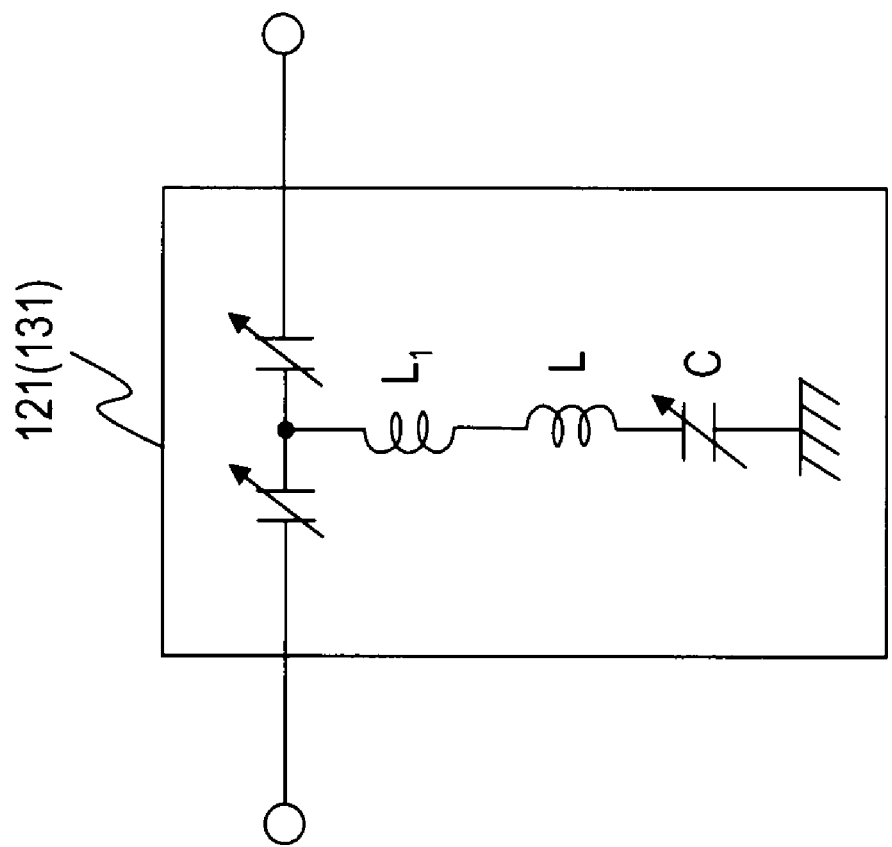
FIG. 25B shows a structure in which variable inductors shown in FIG. 24B are replaced with variable capacitors and other elements.

Variable elements are adjusted such that $Z_I$ and $Z_2$ satisfy expression (1) in FIG. 23A and expression (2) in FIG. 24A at least in $b_1$ and $b_2$. Specific examples of the delay circuit shown in FIG. 23A are illustrated in FIGS. 23B and 23C. Specific examples of the delay circuit shown in FIG. 24A are illustrated in FIGS. 24B and 24C. The same effects can be obtained when the structures illustrated in FIGS. 23B and 23C are connected in series or a circuit equivalent to the series connection is used, or when the structures illustrated in FIGS. 24B and 24C are connected in series or a circuit equivalent to the series connection is used. It is difficult to manufacture variable inductors in many cases. However, if a shunt inductor is used, a variable inductor can be formed by using a variable capacitor. FIGS. 25A and 25B show example structures in which variable inductors in FIG. 23C and FIG. 24B are formed by using variable capacitors, respectively. In FIG. 25A, a series connection grounded at one end, of an inductor having an inductance L and a capacitor having a capacitance C form a series resonator, and the series resonator is designed such that its resonance frequency is the central frequency $f_n$ of the n-th frequency band $b_n$. In that condition, the other end of the series resonator is short-circuited in impedance at $f_n$, and the inductance of the shunt inductor is $L_1$. At the other frequencies, the other end of the series resonator is not short-circuited in impedance, and the inductance of the shunt inductor is $L_1+L_2$. Since the variable capacitor is used in the series resonator, $f_n$ is variable. In addition, if many series resonators are used, more inductances can be handled. Further, the series connection of the inductor having the inductance L and the variable capacitor can be a reactance element having a non-infinite reactance to form $Z_I$ together with the shunt inductor. In FIG. 25B, a shunt inductor is connected to a capacitor having a capacitance C grounded at one end. A series connection of an inductor having an inductance L, which is a part of the shunt inductor, and the capacitor having the capacitance C form a series resonator, and the series resonator is designed such that its resonance frequency is $f_n$. In that condition, the connection point of the shunt inductor and the series resonator is short-circuited in impedance at $f_n$, and the inductance of the shunt inductor is $L_1$. At the other frequencies, a short-circuit state in impedance is located differently, and therefore, the inductance of the shunt inductor can be changed depending on the frequency. In addition, if a variable capacitor is used as the capacitor, more inductances can be handled. Further, the series connection of the inductor having the inductance L and the variable capacitor can be a reactance element having a non-infinite reactance to form $Z_1$ together with the shunt inductor. Making a shunt inductor variable in this manner can also be applied to other embodiments that use similar shunt reactances. In the above-described embodiment, structures in which only a variable capacitor is used without using a variable shunt inductor can be made.

The first parallel block 122a is designed to open in impedance at the connection point to the signal path in $b_1$ and $b_2$ (the impedance from the connection point to the first parallel matching section 122 is infinite or is so large that matching in $b_1$ and $b_2$ is not affected). The open state in impedance created as described above functions like a physical switch that is kept in the off state, isolating the first parallel matching section 122 from the circuit. If the first parallel block 122a does not have a resistance component such as the on resistor of the switch, the amount of current flowing there does not produce loss. The open state in impedance in $b_1$ and $b_2$ can be produced, for example, by configuring the first parallel block 122a as a parallel resonance circuit having a capacitor and an inductor and bringing the resonance frequency to a value higher than or equal to $f_2$ and lower than or equal to $f_1$. If the two frequencies are widely separated, a parallel resonance circuit of a capacitor and an inductor can be configured, with the resonance frequency being the average of the central frequencies. Any low-loss variable element can be used to specify the resonance frequency.

Figure 5:
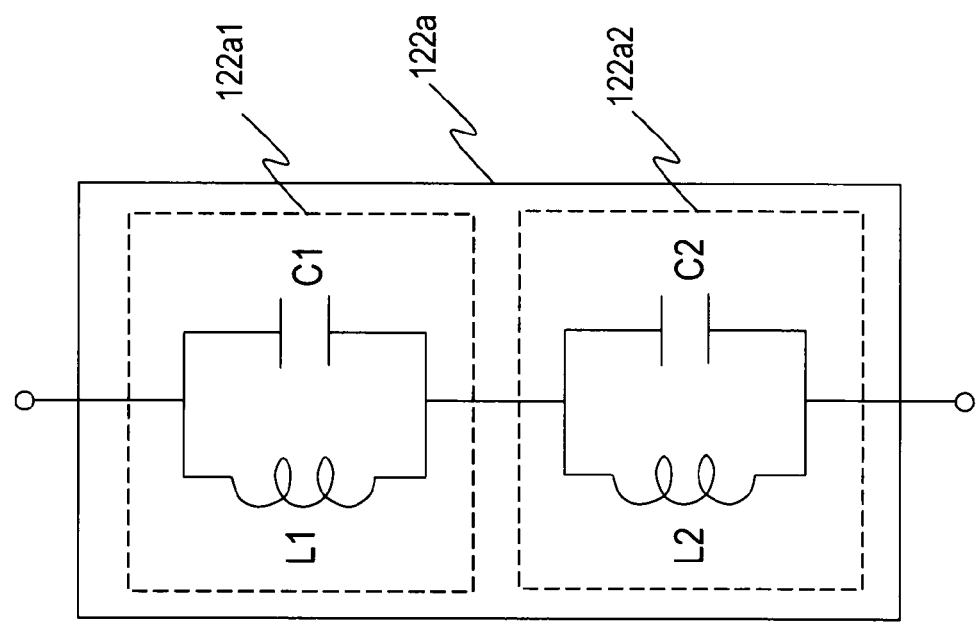
FIG. 5 is a view illustrating a first parallel block formed of two LC resonance circuits.
Figure 6:
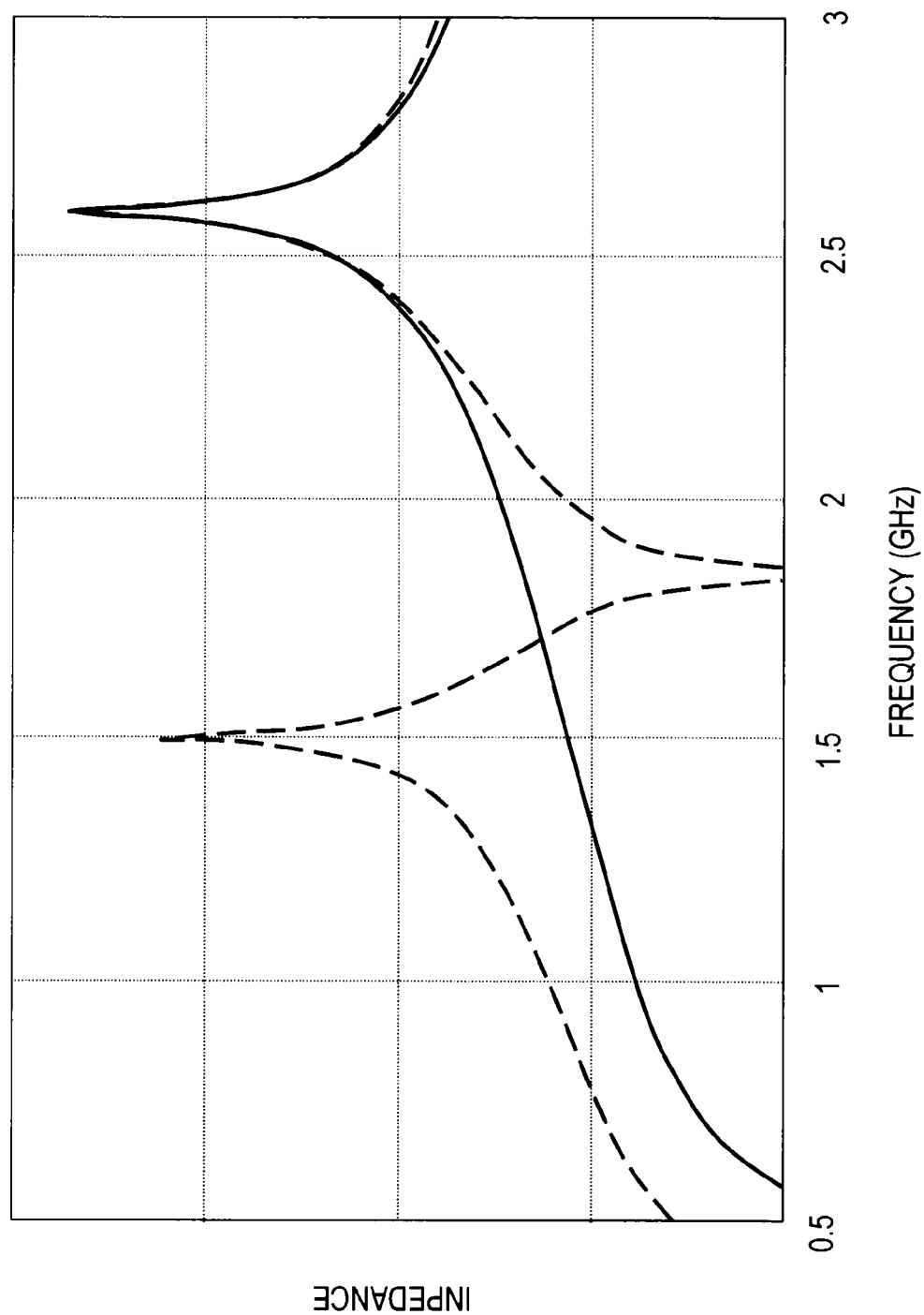
FIG. 6 shows impedance versus frequency characteristics in the structure shown in FIG. 5.
Figure 26:
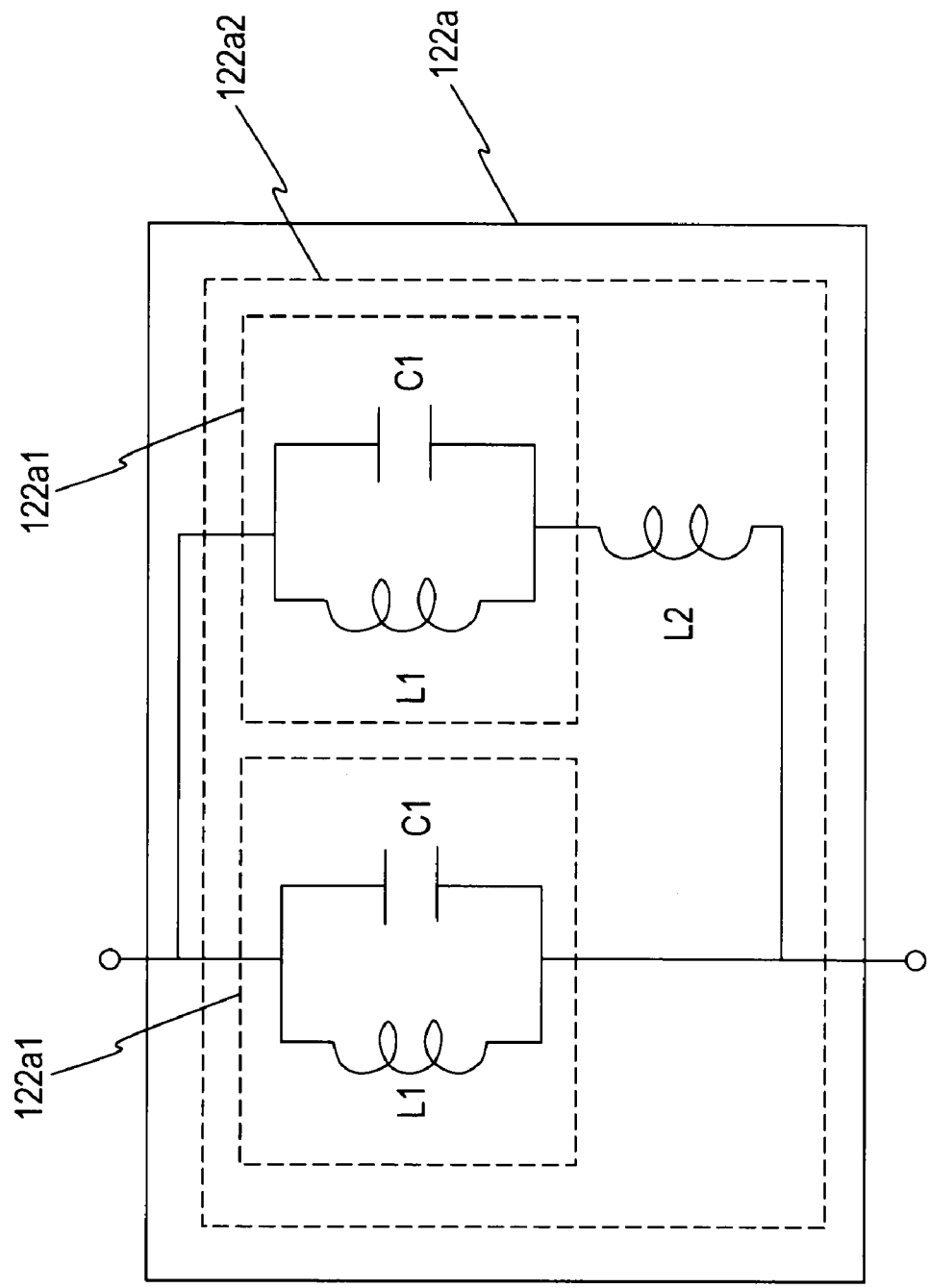
FIG. 26 shows a structure in which a parallel resonance circuit is employed in a first parallel block in the second embodiment.
Figure 27:
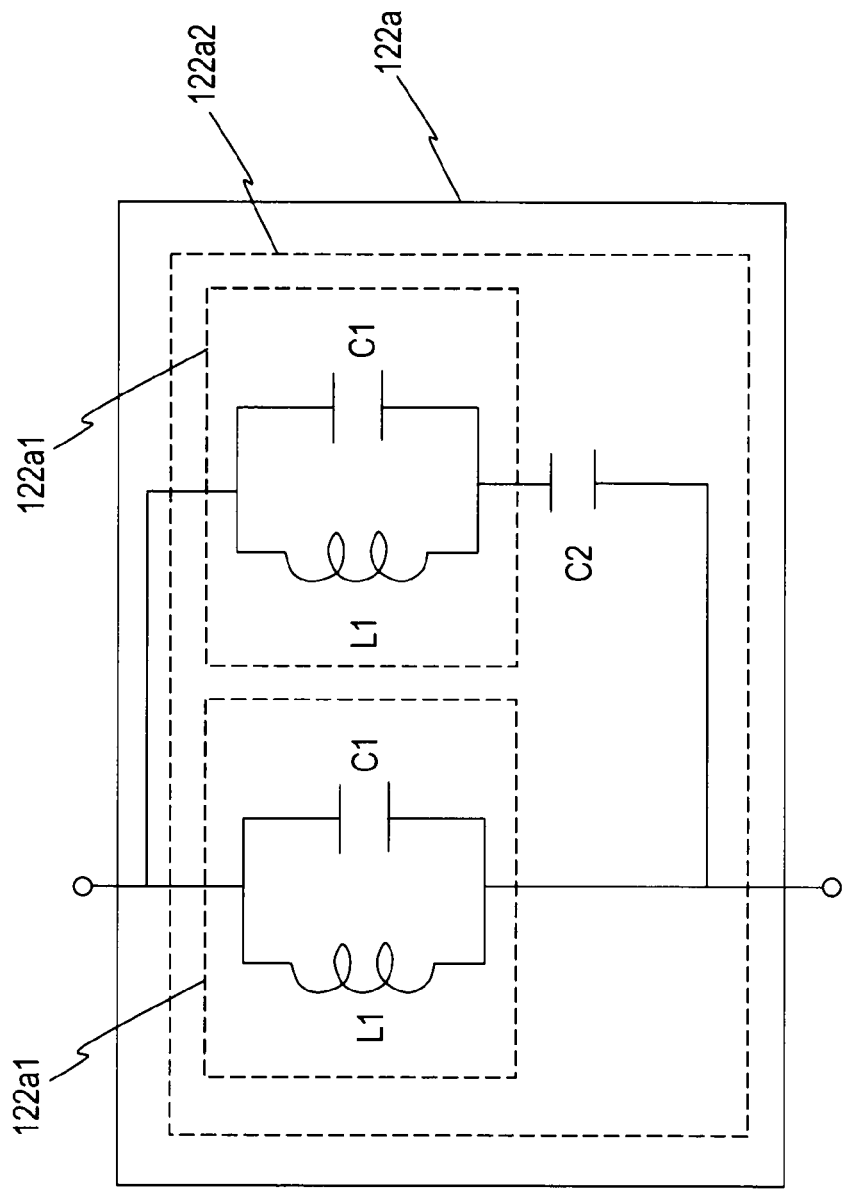
FIG. 27 shows another structure in which a parallel resonance circuit is employed in the first parallel block in the second embodiment.

The open state in impedance in each of the frequency bands can be implemented also by a series connection of parallel resonance circuits 122a1 and 122a2 of capacitors and inductors, the circuits respectively corresponding to the frequency bands, as shown in FIG. 5, or by a structure in which parallel resonance circuits 122a1 for $b_1$ and a resonance circuit 122a2 for $b_2$ formed by adding an inductor or capacitor to one of the parallel resonance circuits 122a1, as shown in FIG. 26 or 27. In the structure shown in FIG. 5, if a transmission line is placed on the signal path side of the parallel resonance circuit 122a1 or between the parallel resonance circuit 122a1 and the parallel resonance circuit 122a2 and if the length is adjusted appropriately, the transmission line can be used for matching in $b_1$ or $b_2$. FIG. 6 shows impedance versus frequency characteristics of the structure shown in FIG. 5, where the parallel resonance circuit 122a1 has a resonance frequency of 2.6 GHz, and the parallel resonance circuit 122a2 has a resonance frequency of 1.5 GHz. The solid line represents the characteristic of the parallel resonance circuit 122a1, and the dashed lines represent the characteristics exhibited by a series connection of the parallel resonance circuit 122a1 and the parallel resonance circuit 122a2. The dashed line in FIG. 6 indicates that the open state in impedance can be implemented in the two frequency bands. In FIG. 5, the two parallel resonance circuits of capacitors and inductors are connected in series. One parallel resonance circuit may be used instead if one or both of the capacitor and inductor used are variable.

Figure 28:
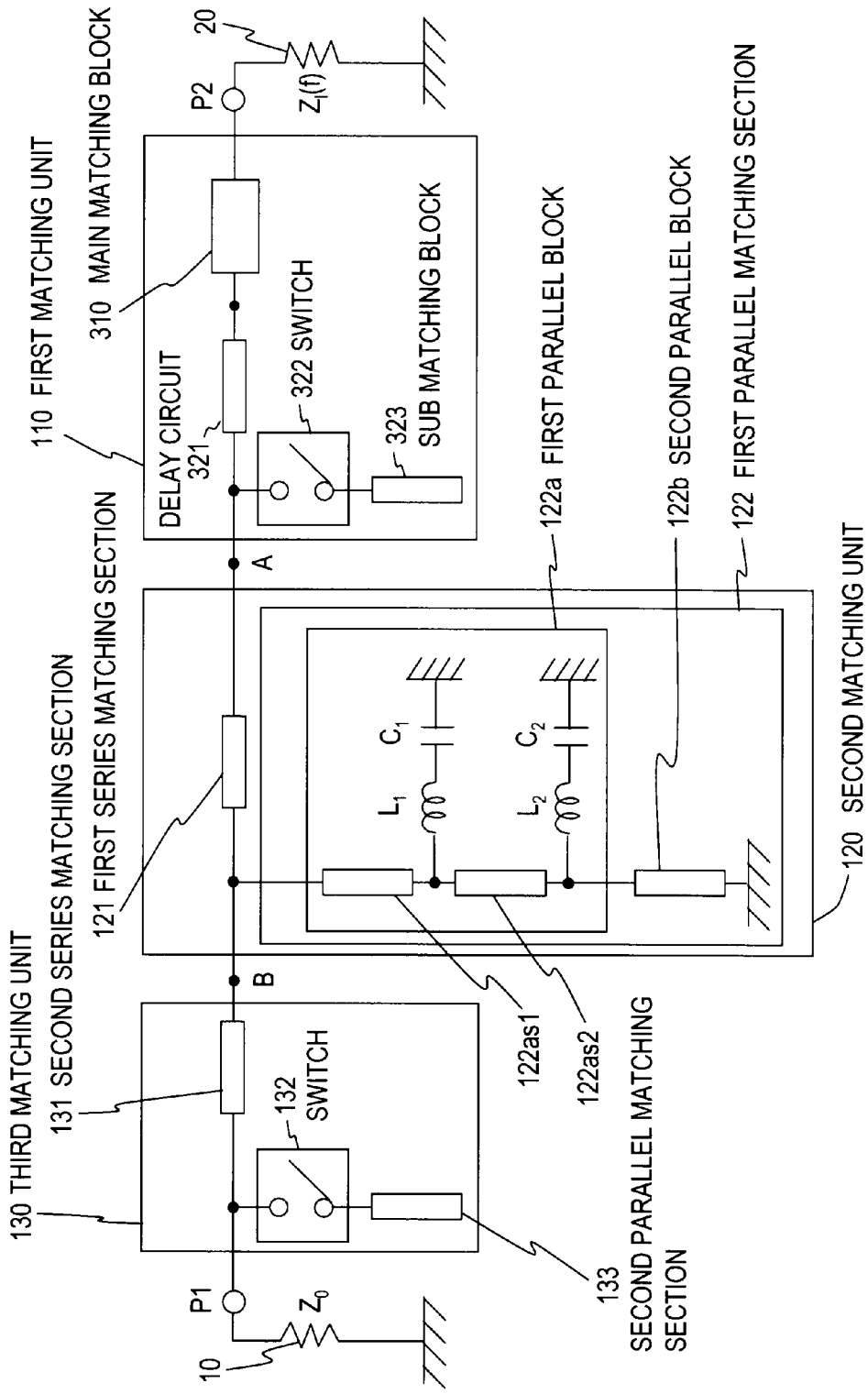
FIG. 28 shows a structure in which series resonance circuits are employed in the first parallel block in the second embodiment.

The first parallel block 122a can be formed by a combination of a transmission line 122as1 having a length equal to a quarter of the wavelength $\lambda_1$ at $f_1$ and a series resonator (resonance frequency $f_1$) having $L_1$ and $C_1$ and a combination of a transmission line 122as2, whose length plus the length of the transmission line 122as1 in total becomes a quarter of the wavelength $\lambda_2$ at $f_2$, and a series resonator (resonance frequency $f_2$) having $L_2$ and $C_2$, as shown in FIG. 28. In this structure, since one end of the transmission line 122as1 where the series resonator having $L_1$ and $C_1$ is connected is short-circuited in impedance in $b_1$, the other end of the transmission line 122as1 becomes open in impedance, so that it can be considered that the first parallel matching section 122 is isolated from the circuit. In $b_2$, since one end of the transmission line 122as2 where the series resonator having $L_2$ and $C_2$ is connected becomes short-circuited in impedance, the end of the transmission line 122as1 on the signal path side becomes open, the transmission lines 122as1 and 122as2 integrally forming a line having a length equal to a quarter of the wavelength $\lambda_2$, so that it can be considered that the first parallel matching section 122 is isolated from the circuit. In $b_3$, the first parallel matching section 122 is present as a specific reactance, and the first parallel block 122a and the second parallel block 122b integrally form the first parallel matching section 122, which has the function of specifying the reactance value for impedance conversion in $b_3$. When the number of matching bands increases, the structure shown in FIG. 28 can be used in the same way. The transmission lines 122as1 and 122as2 having adjusted lengths can be used for matching in $b_1$ and $b_2$.

In FIG. 3, the first parallel block 122a is placed on the signal path side, and the second parallel block 122b is placed on the ground side, but the positions of the first parallel block 122a and the first parallel block 122b can be exchanged as in the first embodiment. With the exchanged positions, however, an open portion in impedance occurs at the connection point between the two blocks, so that the second parallel block 122b connected to the signal path affects the impedance matching state in $b_1$. The influence can be reduced by using a lumped constant element as the second parallel block 122b. Then, the connection point to the signal path can be brought to the open state in impedance, and it can be considered that the first parallel matching section 122 is isolated from the signal path. If the first parallel block 122a is on the ground side, the open state in impedance can be created also by using a transmission line whose length is greater than or equal to a quarter of the wavelength at $f_1$ and smaller than or equal to a quarter of the wavelength at $f_2$, as the first parallel block 122a. If the two frequencies are widely separated, the length can be a quarter of the wavelength at the average frequency of the central frequencies.

The structure of the matching circuit 200 and the other items concerning the principle of matching are the same as those for the matching circuit 100, and a description thereof will be omitted here.

As described above, according to the present invention, a low-loss matching circuit that establishes impedance matching in three frequency bands and reduces the amount of current flowing through the switch can be implemented.

Third Embodiment

The first matching unit 110 in the matching circuit 100 of the first embodiment shown in FIG. 2 can be structured as described in the second embodiment, or can be the matching circuit 100 or any matching circuit for matching signals in three or more frequency bands.

If the first matching unit 110 is a matching circuit that can perform matching in one or more frequency bands of m−1 frequency bands, m−1 being 3 or greater, the matching circuit 300 (see FIG. 2) can establish impedance matching between one or more of the first to (m−1)-th frequency bands and the m-th frequency band $b_m$, (center frequency $f_m$) selectively by opening and closing the switch 132. In that structure, the first matching unit 110 converts impedances $Z_f(f_1), Z_f(f_2), \ldots$, and $Z_f(f_{m-1})$ of the circuit element 20 to Z0 in $b_1$ to $b_{m-1}$. When the switch 132 is in the off state, the matching state (impedance Z0) established by the first matching unit 110 in each of $b_1$ to $b_{m-1}$, is maintained even through the second and third matching units, and the whole matching circuit can establish matching in each of $b_1$ to $b_{m-1}$.

The impedance $Z_f(f_m)$ of the circuit element 20 in $b_m$ is converted by the first matching unit 110, and the impedance viewed from points A to P2 becomes $Z(f_m)$. As in the first embodiment, the impedance $Z(f_m)$ in $b_m$ is converted in stages to Z0 by the second matching unit 120 and the third matching unit 130, without affecting matching in frequency bands $b_1$ to $b_{m-1}$ and without including an element having a parasitic resistance component, such as a switch. To be more specific, the first series matching section 121 and the first parallel matching section 122 are designed to make the conversion ratio $|\Gamma'|$ from the impedance $Z'(f_m)$ viewed from points B to P2 to Z0 smaller than the conversion ratio $|\beta|$ from the impedance $Z(f_m)$ viewed from points A to P2 to Z0, in $b_m$. With the series matching section 131 and the second parallel matching section 133 in the third matching unit 130 designed appropriately for $Z'(f_m)$ while the switch 132 is in the on state, the impedance at P1 can be matched with Z0.

The first series matching section 121 and the second series matching section 131 are formed of a transmission line having a characteristic impedance equal to Z0 or a delay circuit having a circuit equivalent to the transmission line at least in all the frequency bands $b_1$ to $b_{m-1}$. With that structure, the matching state in all the frequency bands $b_1$ to $b_{m-1}$, established by the first matching unit 110 is maintained regardless of the structure of the delay circuit. These circuits can be designed appropriately for matching in $b_m$. The circuit equivalent to the transmission line at least in all the frequency bands $b_1$ to $b_{m-1}$ can be implemented by the circuits shown in FIGS. 23A, 23B, 23C, 24A, 24B, 24C, 25A, and 25B.

Figure 7:
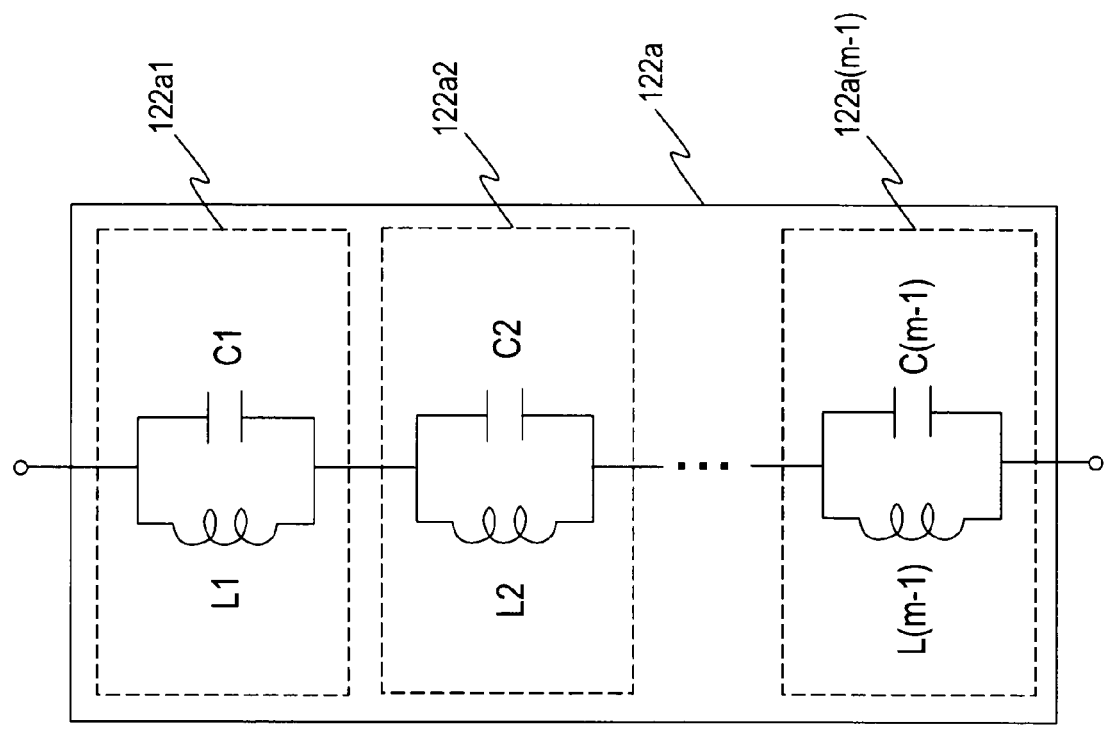
FIG. 7 is a view illustrating a first parallel block formed of (m−1) LC resonance circuits.

The first parallel block 122a is designed to make the connection point to the signal path to the open state in impedance (the impedance viewed from the connection point to the first parallel matching section 122 is infinite or is so large that matching in each of $b_1$ to $b_{m-1}$ is not affected) in each of $b_1$ to $b_{m-1}$. The open state in impedance created as described above functions like a physical switch in the off state, and it can be considered that the first parallel matching section 122 is isolated from the circuit. If the first parallel block 122a does not have a resistance component, such as the on resistor of the switch, the amount of current flowing there does not produce loss. The open state in impedance in each of $b_1$ to $b_{m-1}$ can be created, for example, by using a parallel resonance circuit of a capacitor and an inductor as the first parallel block 122a, with the resonance frequency being greater than or equal to $f_{m-1}$, and smaller than or equal to $f_1$. If the two frequencies are widely separated, a parallel resonance circuit of a capacitor and an inductor can be configured, with the resonance frequency being the average frequency of the central frequencies. The open state in impedance in each of the frequency bands can be implemented also by a series connection of parallel resonance circuits 122a1, 122a2, ..., and 122a(m−1) of capacitors and inductors, each corresponding to the respective frequency band, as shown in FIG. 7. The open state in impedance can also be implemented only by the parallel resonance circuit 122a1 if it has a variable inductor and a variable capacitor.

In FIG. 3, the first parallel block 122a is placed on the signal path side, and the second parallel block 122b is placed on the ground side. The positions of the first parallel block 122a and the second parallel block 122b can be exchanged, as in the first embodiment. With the exchanged positions, however, an open portion in impedance occurs at the connection point between the two blocks, so that the second parallel block 122b connected to the signal path affects the impedance matching state in $b_1$ to $b_{m-1}$. The influence can be reduced by using a lumped constant element as the second parallel block 122b. Then, the connection point to the signal path can be brought to the open state in impedance, and it can be considered that the first parallel matching section 122 is isolated from the signal path. When the first parallel block 122a is on the ground side, the open state in impedance can be created also by using, as the first parallel block 122a, a transmission line whose length is greater than or equal to a quarter of the wavelength at $f_1$ and smaller than or equal to a quarter of the wavelength at $f_{m-1}$. If the two frequencies are widely separated, the length can be a quarter of the wavelength at the average frequency of the central frequencies.

Figure 29:
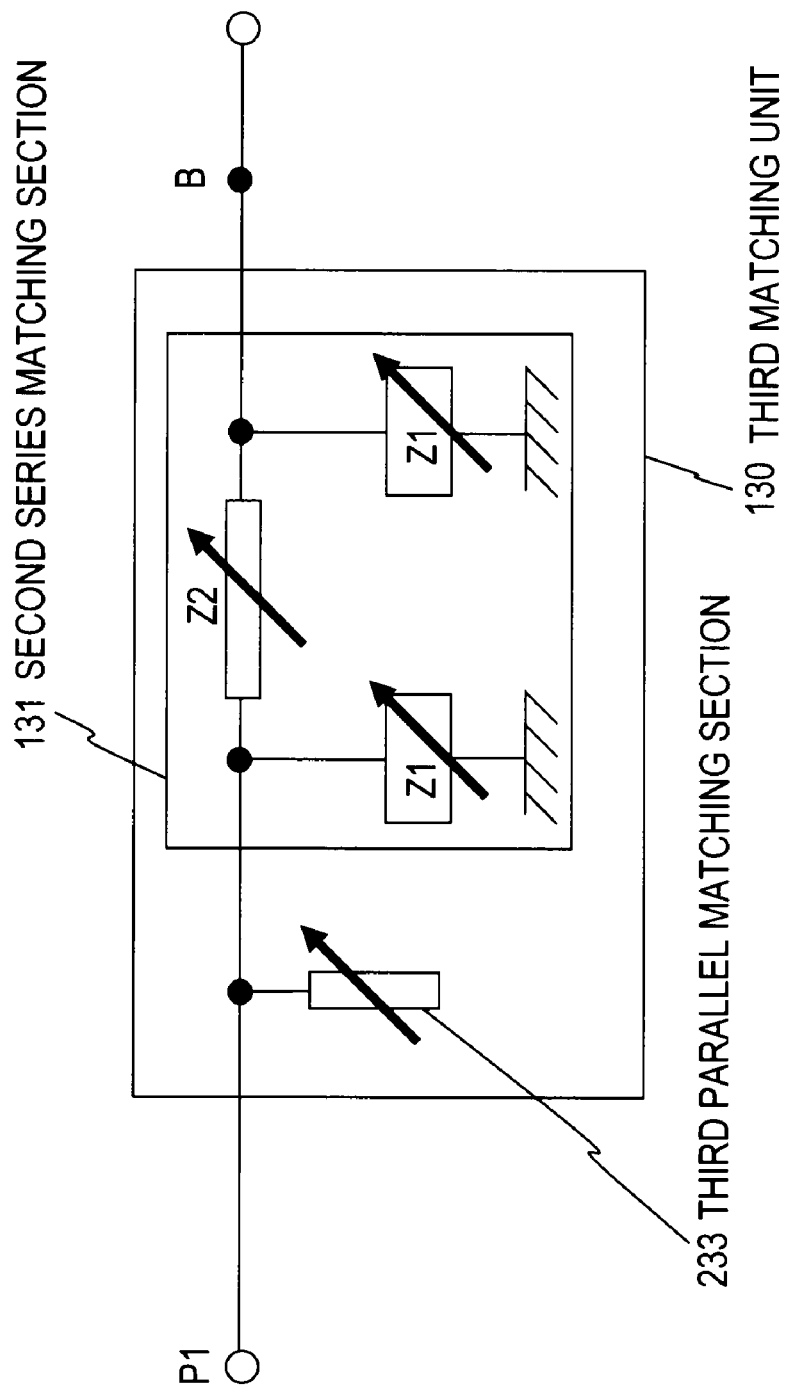
FIG. 29 shows a structure in which a third matching unit 130 is formed of the circuit shown in FIG. 23A and a variable reactance element in a third embodiment.

The second series matching section 131 of the third matching unit 130 is a part of the matching circuit in $b_m$ and converts $Z'(f_m)$ to Z0 together with the second parallel matching section 133 when the switch 132 is on. The second series matching section 131 should maintain matching in all the frequency bands from $b_1$ to $b_{m-1}$ and provide a necessary delay for matching in $b_m$, as described above. The above requirements for the second series matching section 131 in $b_1$ to $b_m$ can be satisfied when variable circuits such as those shown in FIGS. 23A, 23B, 23C, 24A, 24B, 24C, 25A, and 25B are used because the reactance can be specified independently in each of the frequency bands. To increase the frequency at which matching is achieved by the third matching unit 130, any matching circuit that matches signals in three or more frequency bands, such as the matching circuit 100, needs to be applied to the third matching unit 130. A circuit shown in FIG. 29 may be applied to the third matching unit 130. In the circuit shown in FIG. 29, the second series matching section 131 is formed of the variable circuit shown in FIG. 23A, and the series connection of the switch 132 and the second parallel matching section 133 is replaced with a third parallel matching section 233, which is an element or a circuit having a variable reactance. By appropriately specifying the reactance of the third parallel matching section 233, the same effect is achieved as in the case in which the series connection of the switch 132 and the second parallel matching section 133 is used, the effect being that the reactance is not provided in one frequency band (one of $b_1$ to $b_{m-1}$) and is provided in the other frequency band ($b_m$). The second series matching section 131 can be a variable circuit such as those shown in FIGS. 23A, 23B, 23C, 24A, 24B, 24C, 25A, and 25B. The third parallel matching section 233 can be formed, for example, of a variable inductor, a variable capacitor, the circuit shown in FIG. 25A or FIG. 25B, or a circuit equivalent thereto. The shunt elements and the elements connected in series in FIGS. 23A, 23B, 23C, 24A, 24B, 24C, 25A, and 25B may be replaced with a parallel connection or a series connection of a plurality of elements.

The structure of the matching circuit 300 and the other items concerning the principle of matching are the same as those for the matching circuit 100, and a description thereof will be omitted here.

As described above, the present invention can implement a low-loss matching circuit that establishes impedance matching between $b_m$, and one or more of the frequency bands $b_1$ to $b_{m-1}$ selectively by opening and closing the switch, and also reduces the amount of current flowing through the switch.

Fourth Embodiment

Figure 30:
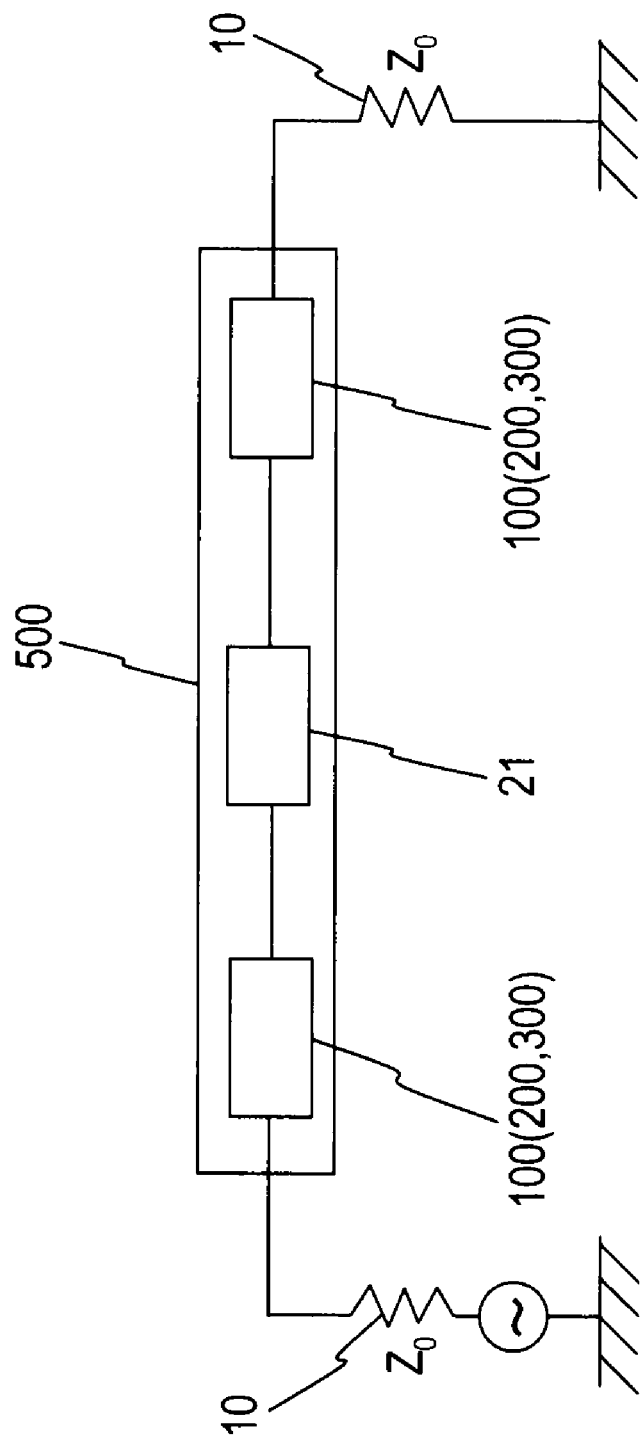
FIG. 30 shows the structure of a multiband amplifier that uses a multiband matching circuit of the present invention.

The matching circuits described in the first to third embodiments can be used to form a multiband power amplifier 500. Specifically, as shown in FIG. 30, for example, an amplification device 21 and matching circuits 100 (or 200 or 300) disposed at the input side and output side of the amplification device 21 form the multiband power amplifier 500. The type of the amplification device is not limited. For example, a field effect transistor (FET) or a heterojunction bipolar transistor (HBT) can be used.

Effects Checked by Computer Simulation

1. Conventional Structure

Figure 8:
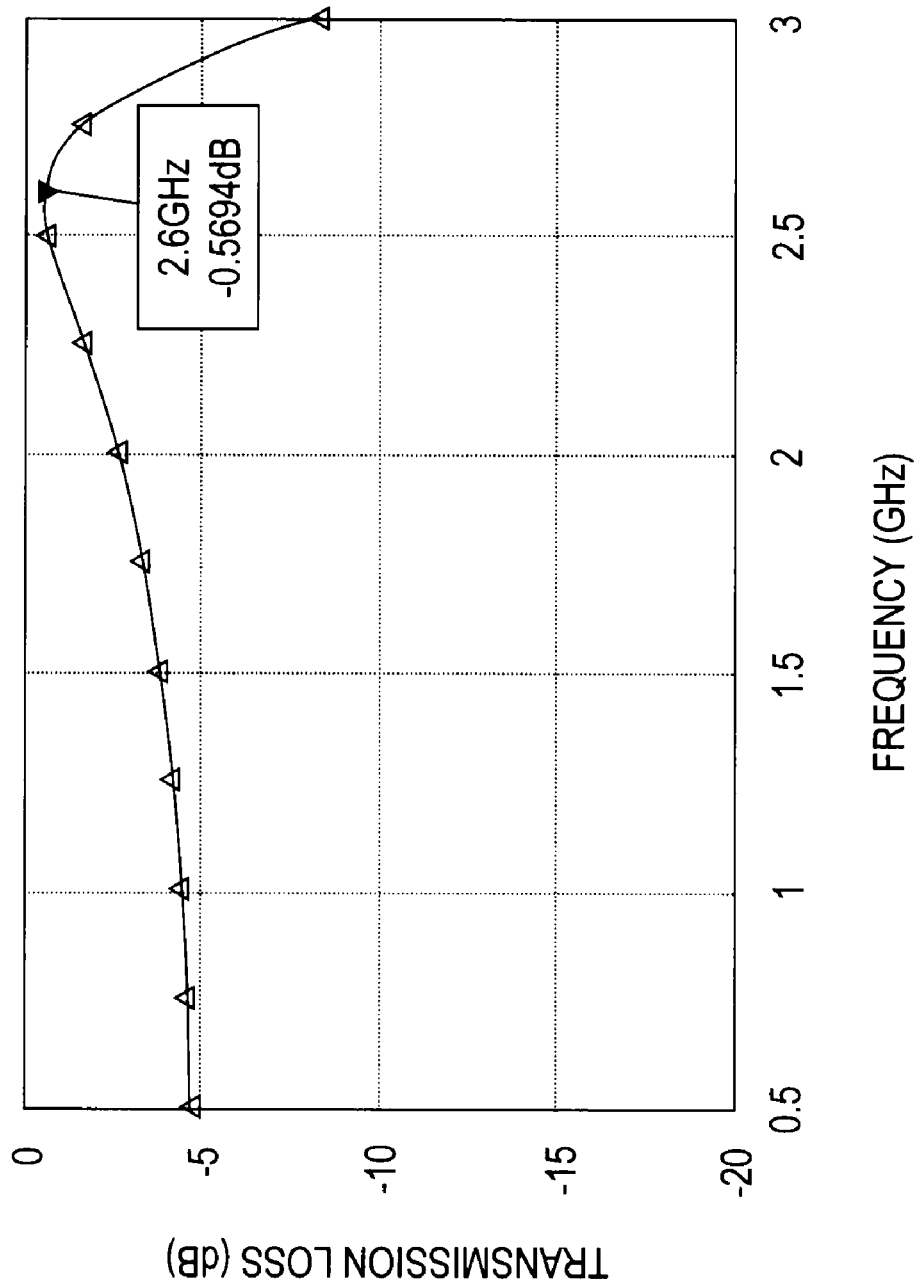
FIG. 8 shows transmission loss characteristics obtained when matching at 2.6 GHz is established with the switch 322 kept in the off state in a conventional structure.
Figure 9:
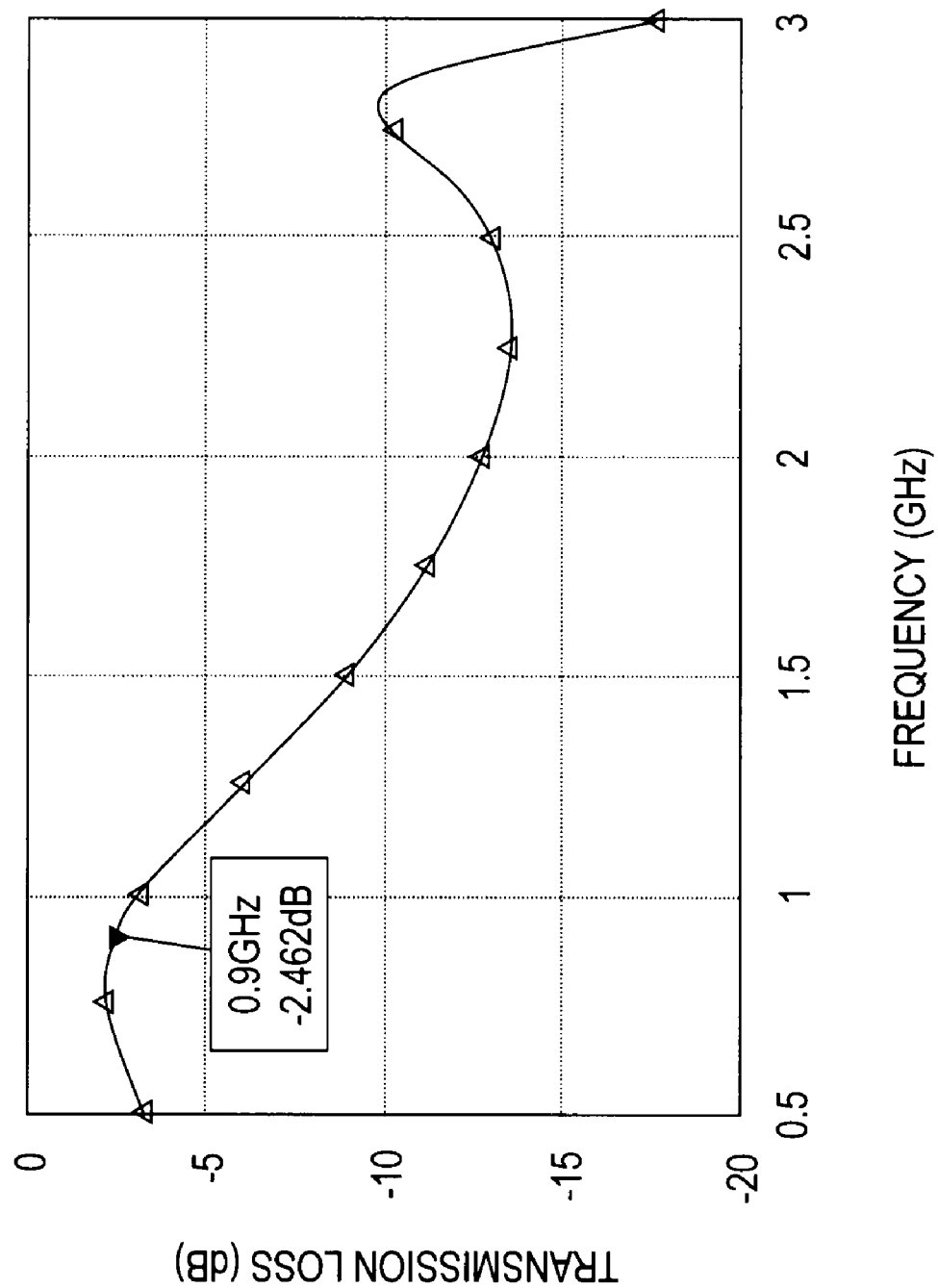
FIG. 9 shows transmission loss characteristics obtained when matching at 0.9 GHz is established with the switch 322 kept in the on state in the conventional structure.
Figure 10:
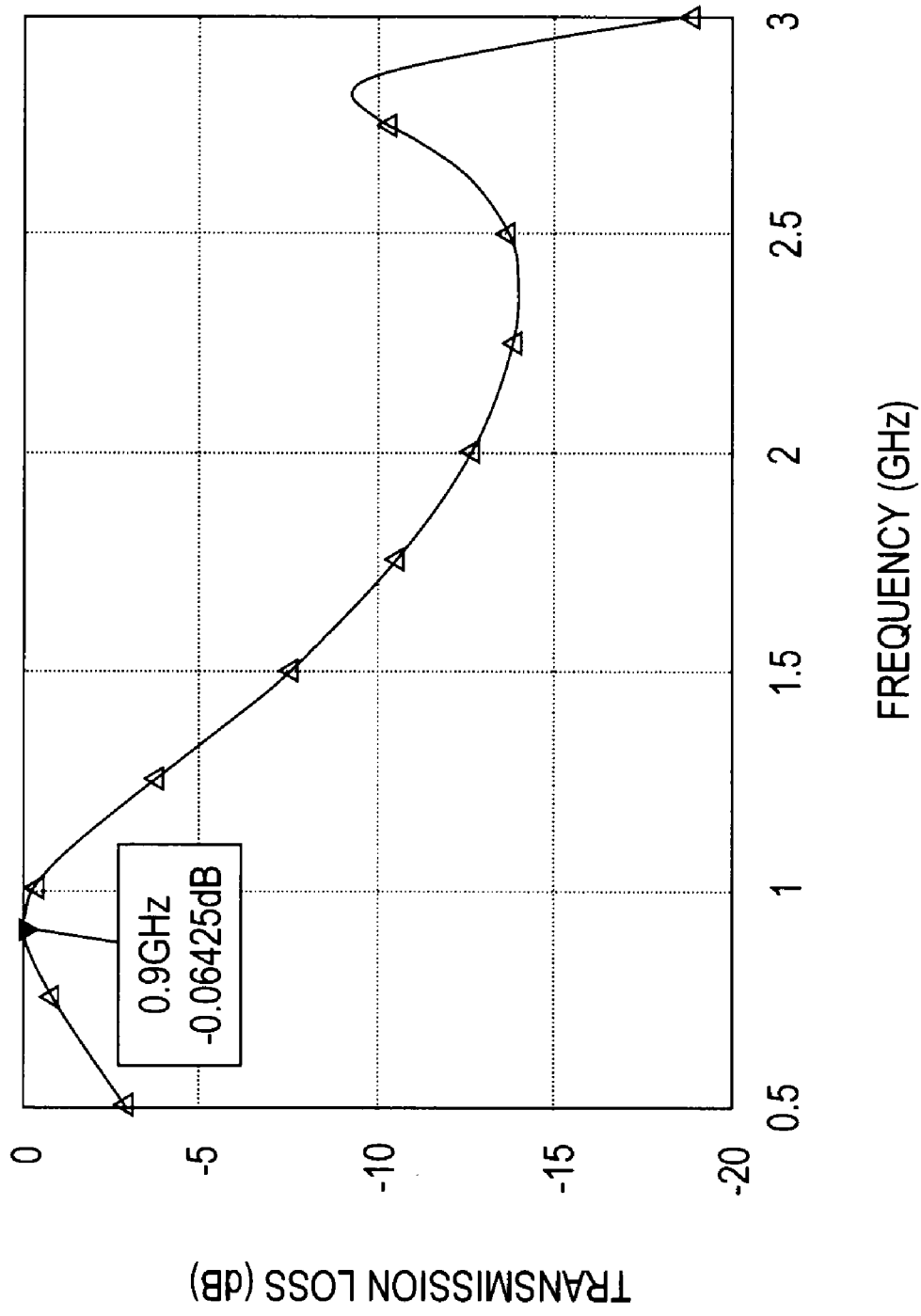
FIG. 10 shows transmission loss characteristics obtained when matching at 0.9 GHz is established with an ideal switch having a resistance of 0Ω used as the switch 322 in the conventional structure.
Figure 16:
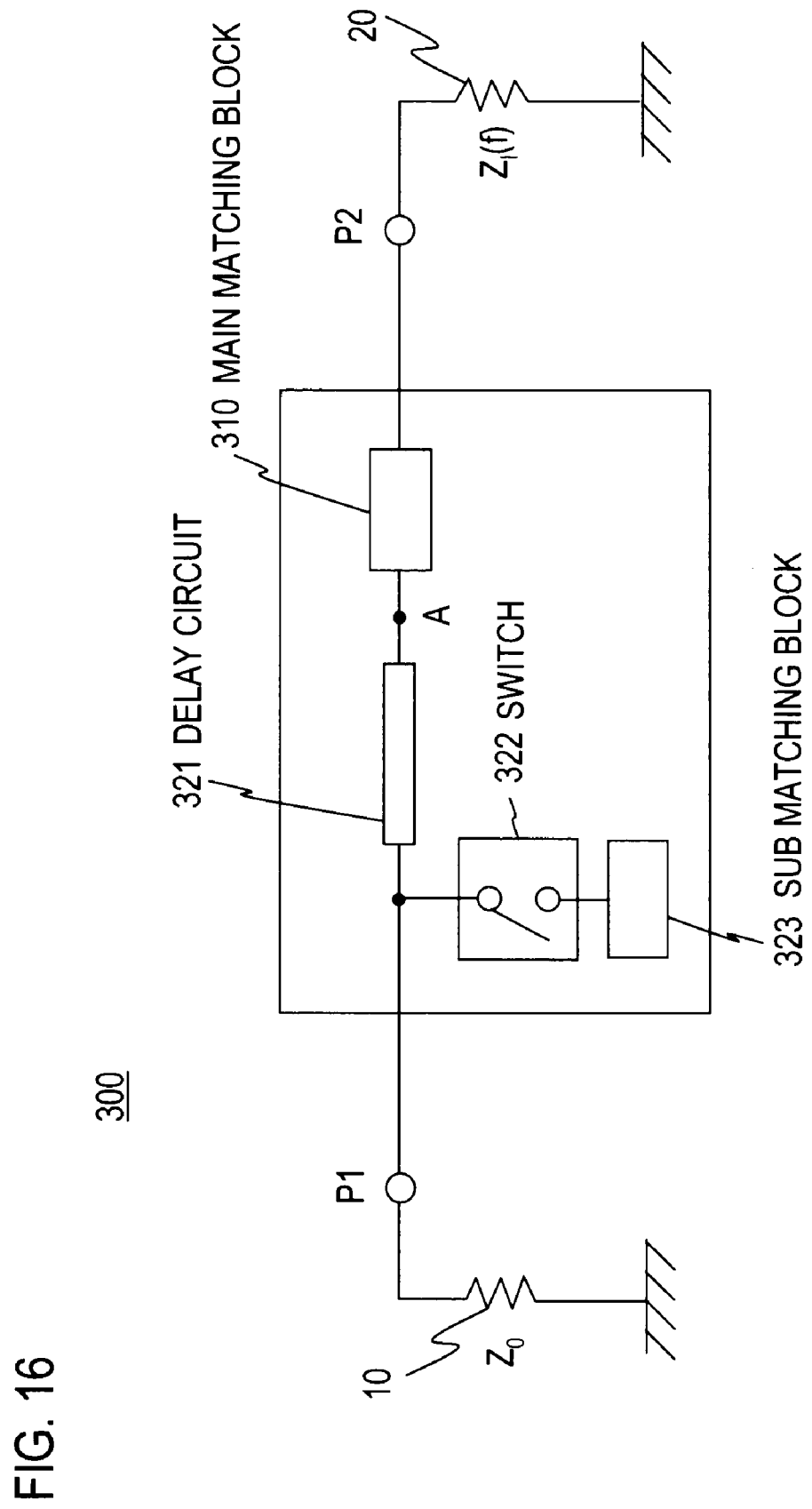
FIG. 16 shows a functional block diagram of the conventional structure.
Figure 17:
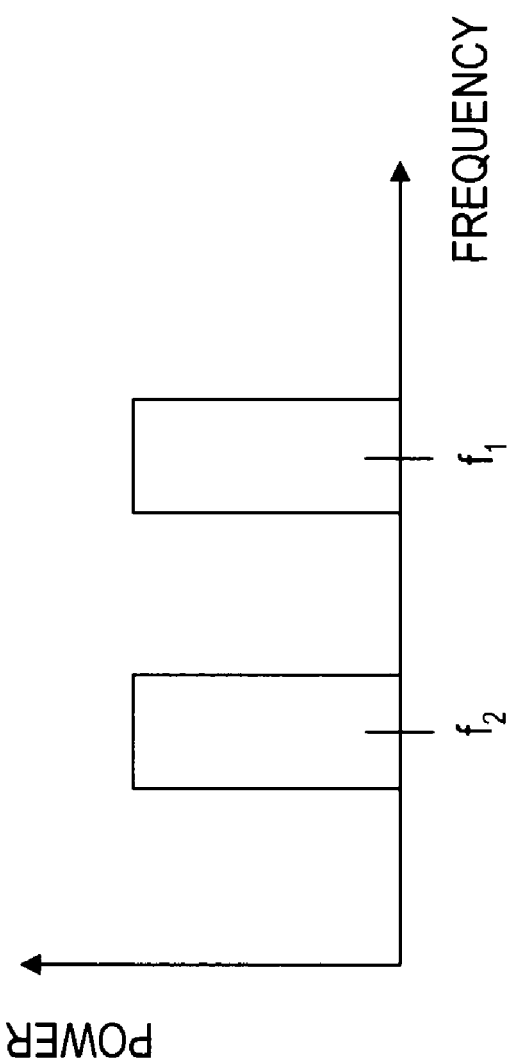
FIG. 17 is a view illustrating the relationship between two frequency bands.

FIGS. 8 to 10 show simulated frequency characteristics of transmission loss from P1 to P2 in the dual-band matching circuit 300 of the related art shown in FIG. 16 ($f_1$: 2.6 GHz and $f_2$: 0.9 GHz).

In this circuit, the impedance $Z_f(f)$ of the circuit element 20 is assumed to be 5Ω at any frequency, for convenience of calculation, and this impedance is matched with the impedance of the system circuit 10, which is 50Ω. The main matching block 310 is a transmission line, and the impedance $Z_f(f_1)$ of the circuit element 20 at $f_1$ is matched with the impedance Z0. The delay circuit 321 is a transmission line having an impedance of 50Ω at $f_1$, which is the same as the matching impedance, in order not to affect matching at $f_1$. The delay circuit 321 and the sub matching block 323 that includes a capacitor match the impedance $Z(f_2)$ at the other end of the main matching block 310 with the impedance Z0 at $f_2$. As an equivalent circuit, a resistor is used for the switch 322, and the resistance is assumed to be 5Ω in the on state and infinity in the off state.

Figure 11:
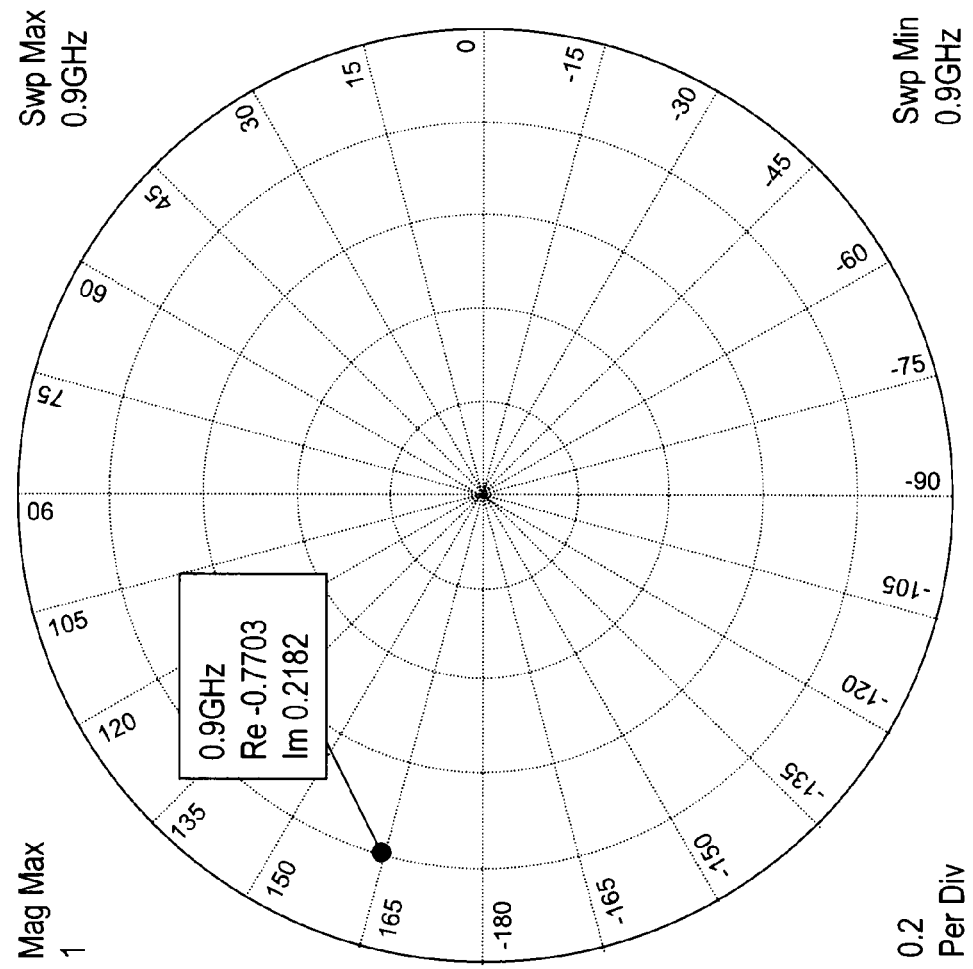
FIG. 11 is a polar chart showing the impedance conversion ratio of $Z(f_2)$ to Z0 in the conventional structure.
Figure 12:
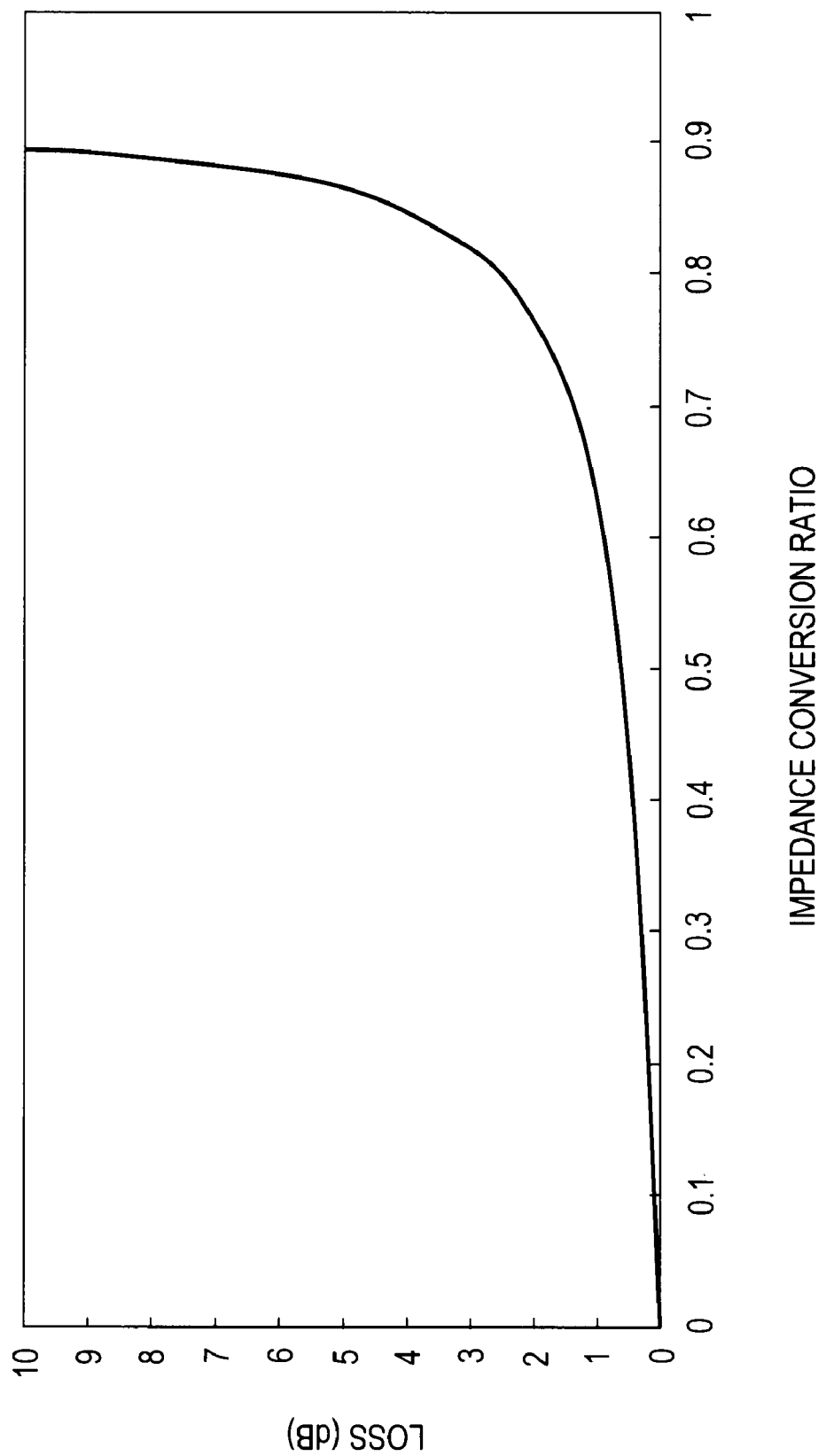
FIG. 12 shows a transmission loss versus impedance conversion ratio characteristic curve based on power consumption by a 5-Ω resistor, obtained by calculating the amount of current flowing through the switch from the impedance conversion ratio.

FIG. 8 shows transmission loss characteristics when matching is established at 2.6 GHz with the switch 322 set to the off state (infinite resistance). FIG. 9 shows transmission loss characteristics when matching is established at 0.9 GHz with the switch 322 set to the on state (resistance of 5Ω). FIG. 10 shows transmission loss characteristics when matching is established at 0.9 GHz with an ideal switch having a resistance of 0Ω used as the switch 322. FIGS. 8 and 10 show that matching at 2.6 GHz and matching at 0.9 GHz without the influence of the on resistance of the switch produces low loss (0.6 dB at 2.6 GHz, and 0.06 dB at 0.9 GHz). In contrast, FIG. 9 shows that the influence of the on resistance of the switch leads to a loss of about 2.5 dB. FIG. 11 is a polar chart showing the impedance conversion ratio of $Z(f_2)$ to Z0 in the simulated structure. According to FIG. 11, the impedance conversion ratio at 0.9 GHz is about 0.8. FIG. 12 shows a transmission loss versus impedance conversion ratio characteristic curve based on power consumption by a resistor (5Ω), obtained by calculating the amount of current flowing through the switch from the impedance conversion ratio. The figure shows that an impedance conversion ratio of 0.72 leads to loss of 2.5 dB, which almost agrees with the results shown in FIGS. 9 and 11.

2. Structure in the present invention

Figure 13:
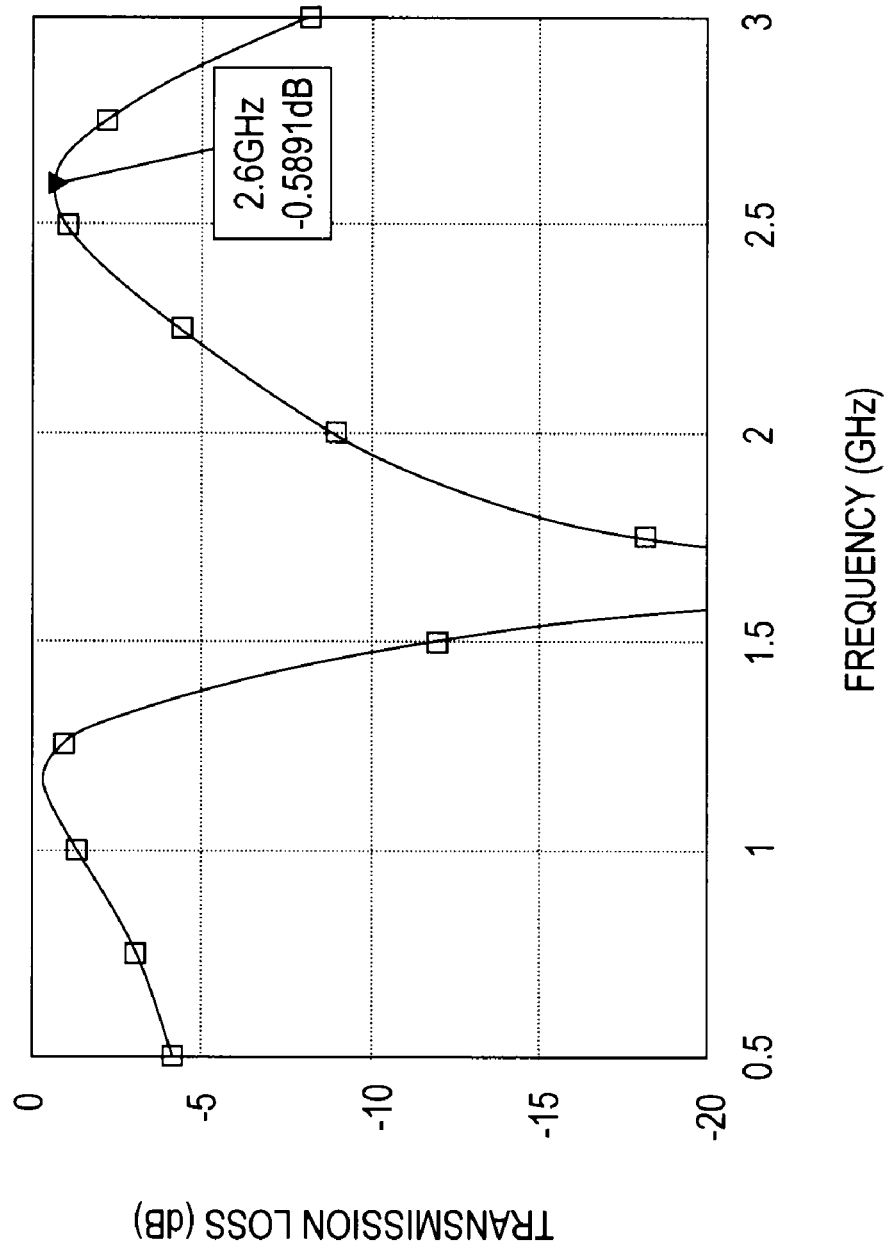
FIG. 13 shows transmission loss characteristics obtained when matching at 0.9 GHz is established with the switch 132 kept in the on state in the present invention.
Figure 14:
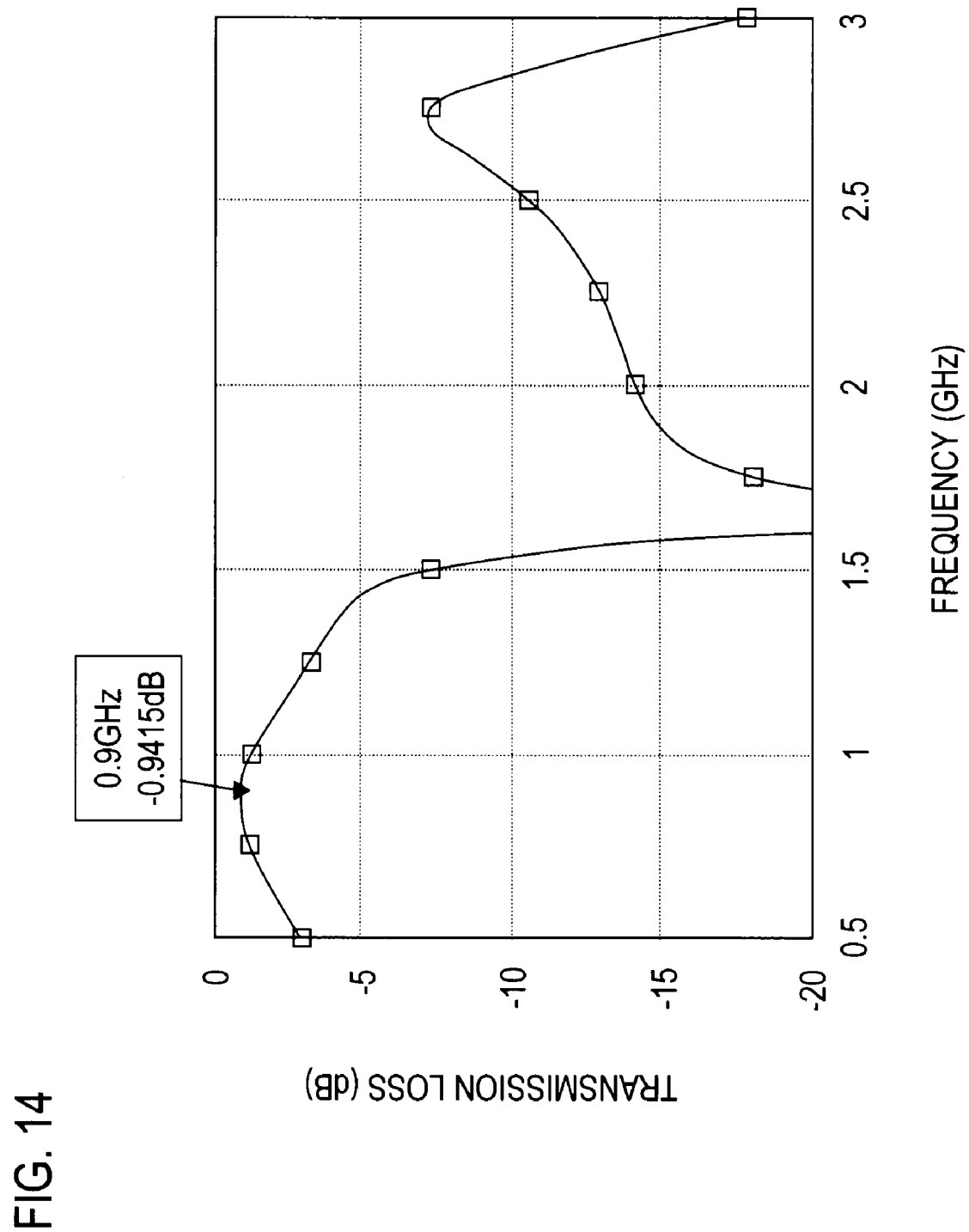
FIG. 14 shows transmission loss characteristics obtained when matching at 0.9 GHz is established with an ideal switch having a resistance of 0Ω used as the switch 132 in the present invention.

FIGS. 13 to 14 show simulated frequency characteristics of transmission loss from P1 to P2 in the dual-band matching circuit 100 according to the present invention, shown in FIG. 2 ($f_1$: 2.6 GHz and $f_2$: 0.9 GHz).

Also in this circuit, the impedance $Z_f(f)$ of the circuit element 20 is assumed to be 5Ω at any frequency, for convenience of calculation, and this impedance is matched with the impedance of the system circuit 10, which is 50Ω. The main matching block 110 is a transmission line, and the impedance $Z_f(f_1)$ of the circuit element 20 at $f_1$ is matched with the impedance Z0. The first series matching section 121 and the second series matching section 131 are also transmission lines having an impedance of 50Ω at $f_1$, which is the same as the impedance of the system circuit 10, so as not to affect matching at $f_1$. The first parallel block 122a uses a capacitor. The second parallel block 122b is a parallel resonance circuit having a 1-nH inductor and a 3.8-pF capacitor so as to have a resonance frequency of 2.6 GHz, which equals $f_1$. The second series matching section 131 and the second parallel matching section 133 formed of a capacitor match the impedance $Z'(f_2)$ at the other end of the second matching unit 120 with Z0 at $f_2$. As an equivalent circuit, a resistor is used for the switch 132, and the resistance is assumed to be 5Ω in the on state and infinity in the off state.

Figure 15:
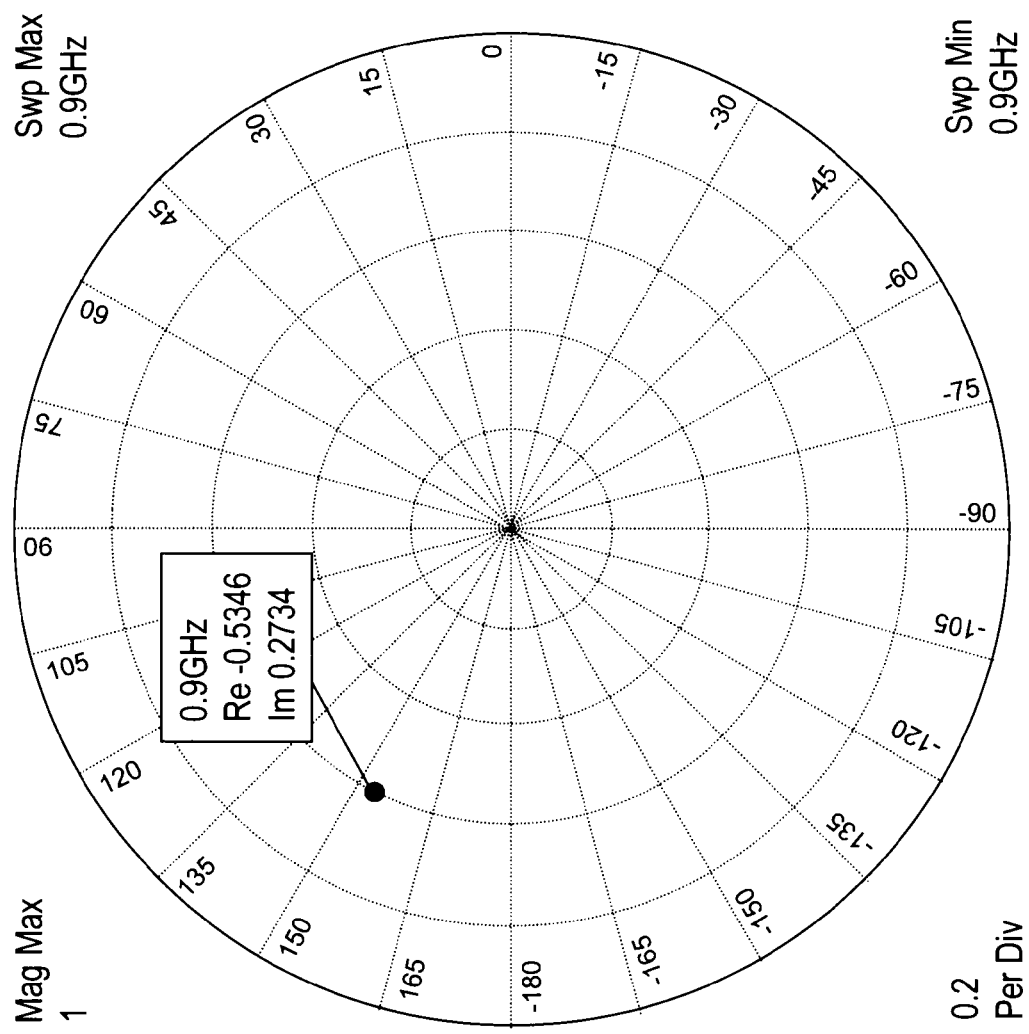
FIG. 15 is a polar chart showing the impedance conversion ratio between $Z(f_2)$ and Z0 in the present invention.

FIG. 13 shows transmission loss characteristics (0.6 dB) when matching is established at 2.6 GHz with the switch 132 set to the off state (infinite resistance), and FIG. 14 shows transmission loss characteristics (0.9 dB) when matching is established at 0.9 GHz with the switch 132 set to the on state (resistance of 5Ω). FIGS. 9 and 14 indicate that matching at 0.9 GHz produces an improvement of about 1.5 dB, in comparison with the conventional structure. FIG. 15 is a polar chart showing the impedance conversion ratio between $Z(f_2)$ and Z0 in the simulated structure. The chart shows that the impedance conversion ratio at 0.9 GHz is about 0.6, which is 0.3 smaller than that shown in FIG. 11. In the transmission loss versus impedance conversion ratio characteristic curve, shown in FIG. 12, the loss at an impedance conversion ratio of 0.6 is 0.9 dB, which almost agrees with the results shown in FIG. 13.

Consequently, it has been confirmed that by providing the second matching unit 120 to reduce the impedance conversion ratio, the amount of current flowing through the switch is reduced, and the loss of the switch is reduced.

Figure 31:
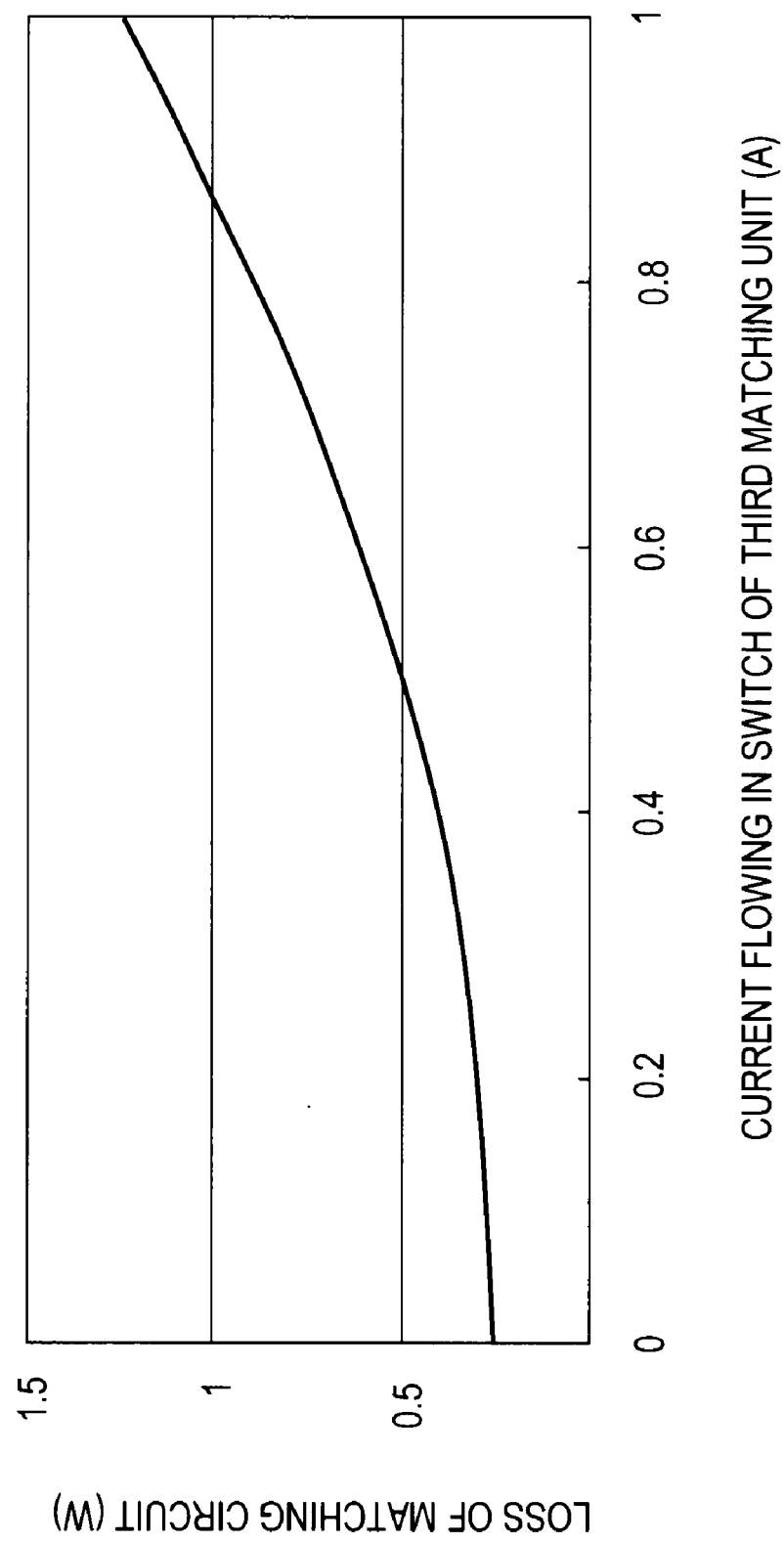
FIG. 31 shows the relationship between the current flowing through a switch of the third matching unit and the loss of the whole matching circuit, when a second matching unit in a structure according to the present invention includes a resistance component.

In the description given above, the second matching unit 120 is formed of elements not containing a resistance component. Even if a resistance component is included, the whole matching circuit can reduce loss, as described below. For convenience of explanation, let current 1-A flow through the switch 132 of the third matching unit 130 when the second matching unit 120 is not provided. If the resistance of the switch 132 is 1Ω, the loss at the switch 132 is 1-W. On the assumption that the first parallel matching section 122 of the second matching unit 120 includes a 1-Ω resistance component, if the amount of current flowing there is 0.5-A, the calculated loss of the entire matching circuit with reduced current flowing through the third matching unit 130 is shown in FIG. 31. The figure indicates that even if the first parallel matching section 122 includes a resistance component, the loss of the entire matching circuit can be reduced by reducing the amount of current flowing through the switch 132 in the third matching unit 130. Because a low-loss switch can be used in the second matching unit 120, the degree of freedom in design of the second matching unit 120 can be increased.

What is claimed is:

1. A multiband matching circuit for matching an impedance $Z_f(f)$ of a circuit element having frequency dependence to a predetermined impedance Z0 of a system circuit in first and second frequency bands when the multiband matching circuit is disposed in a signal path between the circuit element having the impedance $Z_f(f)$ and the system circuit having the impedance Z0, the multiband matching circuit comprising:

a first matching unit connected at one end to the circuit element and adapted to convert the impedance of the circuit element to Z0 in the first frequency band;

a second matching unit which comprises:

a first series matching section connected at one end to the other end of the first matching unit, which is a transmission line whose characteristic impedance is equal to the impedance Z0 of the system circuit or a circuit equivalent to the transmission line at least in the first frequency band; and
a first parallel matching section connected at one end to the signal path at the other end of the first series matching section and grounded at the other end; and
a third matching unit which comprises:
a second series matching section connected at one end to the other end of the first series matching section and connected at the other end to the system circuit, which is a transmission line whose characteristic impedance is equal to the impedance Z0 of the system circuit or a circuit equivalent to the transmission line at least in the first frequency band;
a switch connected at one end to the signal path at the other end of the second series matching section; and
a second parallel matching section connected at one end to the other end of the switch;
the first parallel matching section being configured to open in impedance at a connection point to the signal path in the first frequency band;
the first series matching section and the first parallel matching section being designed to make an impedance conversion ratio of an impedance $Z'(f_2)$, which is viewed from a connection point between the second matching unit and the third matching unit to the circuit element to the impedance Z0 of the system circuit smaller than an impedance conversion ratio of an impedance $Z(f_2)$, which is viewed from a connection point between the first matching unit and the second matching unit to the circuit element to the impedance Z0 of the system circuit, in the second frequency band, while the switch is in the on state, and the second series matching section and the second parallel matching section being designed to convert the impedance $Z'(f_2)$ to Z0; and
the multiband matching circuit matching the impedance of the circuit element to Z0 in the first frequency band and the second frequency band selectively by opening and closing the switch;
wherein the first parallel matching section comprises a first parallel block connected at one end to the signal path and a second parallel block connected at one end to the other end of the first parallel block and grounded at the other end; and
the first parallel block is configured to open in impedance at a connection point to the signal path in the first frequency band.

2. A multiband matching circuit for matching an impedance $Z_f(f)$ of a circuit element having frequency dependence to a predetermined impedance Z0 of a system circuit in first and second frequency bands when the multiband matching circuit is disposed in a signal path between the circuit element having the impedance $Z_f(f)$ and the system circuit having the impedance Z0, the multiband matching circuit comprising:
a first matching unit connected at one end to the circuit element and adapted to convert the impedance of the circuit element to Z0 in the first frequency band;
a second matching unit which comprises:
a first series matching section connected at one end to the other end of the first matching unit, which is a transmission line whose characteristic impedance is equal to the impedance Z0 of the system circuit or a circuit equivalent to the transmission line at least in the first frequency band; and
a first parallel matching section connected at one end to the signal path at the other end of the first series matching section and grounded at the other end; and
a third matching unit which comprises:
a second series matching section connected at one end to the other end of the first series matching section and connected at the other end to the system circuit, which is a transmission line whose characteristic impedance is equal to the impedance Z0 of the system circuit or a circuit equivalent to the transmission line at least in the first frequency band;
a switch connected at one end to the signal path at the other end of the second series matching section; and
a second parallel matching section connected at one end to the other end of the switch;
the first parallel matching section being configured to open in impedance at a connection point to the signal path in the first frequency band;
the first series matching section and the first parallel matching section being designed to make an impedance conversion ratio of an impedance $Z'(f_2)$, which is viewed from a connection point between the second matching unit and the third matching unit to the circuit element to the impedance Z0 of the system circuit smaller than an impedance conversion ratio of an impedance $Z(f_2)$, which is viewed from a connection point between the first matching unit and the second matching unit to the circuit element to the impedance Z0 of the system circuit, in the second frequency band, while the switch is in the on state, and the second series matching section and the second parallel matching section being designed to convert the impedance $Z'(f_2)$ to Z0; and
the multiband matching circuit matching the impedance of the circuit element to Z0 in the first frequency band and the second frequency band selectively by opening and closing the switch;
wherein the first parallel matching section comprises a second parallel block connected at one end to the signal path and a first parallel block connected at one end to the other end of the second parallel block and grounded at the other end;
the second parallel block is formed of a lumped constant element; and
the first parallel block is configured to open in impedance at a connection point to the second parallel block in the first frequency band.

3. A multiband matching circuit for matching an impedance $Z_f(f)$ of a circuit element having frequency dependence to a predetermined impedance Z0 of a system circuit in first to m-th frequency bands when the multiband matching circuit is disposed in a signal path between the circuit element having the impedance $Z_f(f)$ and the system circuit having the predetermined impedance Z0, where m≧3 and central frequencies $f_1 > f_2 > \ldots > f_m$, the multiband matching circuit comprising:
a first matching unit connected at one end to the circuit element and adapted to convert the impedance of the circuit element to Z0 in each of the first to (m−1)-th frequency bands;
a second matching unit which comprises:
a first series matching section connected at one end to the other end of the first matching unit, which is a transmission line whose characteristic impedance is equal to the impedance Z0 of the system circuit or a circuit equivalent to the transmission line at least in each of the first to (m−1)-th frequency bands; and
a first parallel matching section connected at one end to the signal path at the other end of the first series matching section and grounded at the other end; and a third matching unit which comprises:
  a second series matching section connected at one end to the other end of the first series matching section and connected at the other end to the system circuit, which is a transmission line whose characteristic impedance is equal to the impedance Z0 of the system circuit or a circuit equivalent to the transmission line at least in each of the first to (m−1)-th frequency bands;
  a switch connected at one end to the signal path at the other end of the second series matching section; and
  a second parallel matching section connected at one end to the other end of the switch;
the first parallel matching section being configured to open in impedance at a connection point to the signal path in the first to (m−1)-th frequency bands;
the first series matching section and the first parallel matching section being designed to make an impedance conversion ratio of an impedance $Z'(f_m)$, which is viewed from a connection point between the second matching unit and the third matching unit to the circuit element, to the impedance Z0 of the system circuit smaller than an impedance conversion ratio of an impedance $Z(f_m)$, which is viewed from the connection point between the first matching unit and the second matching unit to the circuit element, to the impedance Z0 of the system circuit, in the m-th frequency band, while the switch is in the on state, and the second series matching section and the second parallel matching section being designed to convert the impedance $Z'(f_m)$ to Z0; and
the multiband matching circuit matching the impedance of the circuit element with Z0 in one or more of the first to (m−1)-th frequency bands and the m-th frequency band selectively by opening and closing the switch;
wherein the first parallel matching section comprises a first parallel block connected at one end to the signal path and a second parallel block connected at one end to the other end of the first parallel block and grounded at the other end; and
the first parallel block is configured to open in impedance at a connection point to the signal path in the first frequency band.

4. A multiband matching circuit for matching an impedance $Z_f(f)$ of a circuit element having frequency dependence to a predetermined impedance Z0 of a system circuit in first to m-th frequency bands when the multiband matching circuit is disposed in a signal path between the circuit element having the impedance $Z_f(f)$ and the system circuit having the predetermined impedance Z0, where m≧3 and central frequencies $f_1 > f_2 > \ldots > f_m$, the multiband matching circuit comprising:
  a first matching unit connected at one end to the circuit element and adapted to convert the impedance of the circuit element to Z0 in each of the first to (m−1)-th frequency bands;
  a second matching unit which comprises:
    a first series matching section connected at one end to the other end of the first matching unit, which is a transmission line whose characteristic impedance is equal to the impedance Z0 of the system circuit or a circuit equivalent to the transmission line at least in each of the first to (m−1)-th frequency bands; and
    a first parallel matching section connected at one end to the signal path at the other end of the first series matching section and grounded at the other end; and
  a third matching unit which comprises:
    a second series matching section connected at one end to the other end of the first series matching section and connected at the other end to the system circuit, which is a transmission line whose characteristic impedance is equal to the impedance Z0 of the system circuit or a circuit equivalent to the transmission line at least in each of the first to (m−1)-th frequency bands; and
    a third parallel matching section connected at one end to the signal path at a other end of the second series matching section, which is an element or a circuit having a variable reactance;
the first parallel matching section being configured to open in impedance at a connection point to the signal path in the first to (m−1)-th frequency bands;
the first series matching section and the first parallel matching section being designed to make an impedance conversion ratio of an impedance $Z'(f_m)$, which is viewed from a connection point between the second matching unit and the third matching unit to the circuit element to the impedance Z0 of the system circuit smaller than an impedance conversion ratio of an impedance $Z(f_m)$, which is viewed from the connection point between the first matching unit and the second matching unit to the circuit element to the impedance Z0 of the system circuit, in the m-th frequency band, while the third parallel matching section provides the variable reactance according to the frequency characteristics of the third parallel matching section, and the second series matching section and the third parallel matching section being designed to convert the impedance $Z'(f_m)$ to Z0; and
the multiband matching circuit matching the impedance of the circuit element with Z0 in one or more of the first to (m−1)-th frequency bands and the m-th frequency band selectively by the frequency characteristics of the third parallel matching section:,
wherein the first parallel matching section comprises a first parallel block connected at one end to the signal path and a second parallel block connected at one end to the other end of the first parallel block and grounded at the other end; and
the first parallel block is configured to open in impedance at a connection point to the signal path in the first frequency band.

5. A multiband matching circuit for matching an impedance $Z_f(f)$ of a circuit element having frequency dependence to a predetermined impedance Z0 of a system circuit in first to m-th frequency bands when the multiband matching circuit is disposed in a signal path between the circuit element having the impedance $Z_f(f)$ and the system circuit having the predetermined impedance Z0, where m≧3 and central frequencies $f_1 > f_2 > \ldots > f_m$, the multiband matching circuit comprising:
  a first matching unit connected at one end to the circuit element and adapted to convert the impedance of the circuit element to Z0 in each of the first to (m−1)-th frequency bands;
  a second matching unit which comprises:
    a first series matching section connected at one end to the other end of the first matching unit, which is a transmission line whose characteristic impedance is equal to the impedance Z0 of the system circuit or a circuit equivalent to the transmission line at least in each of the first to (m−1)-th frequency bands; and
    a first parallel matching section connected at one end to the signal path at the other end of the first series matching section and grounded at the other end; and
  a third matching unit which comprises:
    a second series matching section connected at one end to the other end of the first series matching section and connected at the other end to the system circuit, which is a transmission line whose characteristic impedance is equal to the impedance Z0 of the system circuit or a circuit equivalent to the transmission line at least in each of the first to (m−1)-th frequency bands;

a switch connected at one end to the signal path at the other end of the second series matching section; and a second parallel matching section connected at one end to the other end of the switch;

the first parallel matching section being configured to open in impedance at a connection point to the signal path in the first to (m−1)-th frequency bands;

the first series matching section and the first parallel matching section being designed to make an impedance conversion ratio of an impedance Z' f which is viewed from a connection point between the second matching unit and the third matching unit to the circuit element, to the impedance Z0 of the system circuit smaller than an impedance conversion ratio of an impedance $Z(f_m)$, which is viewed from the connection point between the first matching unit and the second matching unit to the circuit element, to the impedance Z0 of the system circuit, in the m-th frequency band, while the switch is in the on state, and the second series matching section and the second parallel matching section being designed to convert the impedance $Z'(f_m)$ to Z0: and the multiband matching circuit matching the impedance of the circuit element with Z0 in one or more of the first to (m−1)-th frequency bands and the m-th frequency band selectively by opening and closing the switch;

wherein the first parallel matching section comprises a second parallel block connected at one end to the signal path and a first parallel block connected at one end to the other end of the second parallel block and grounded at the other end;

the second parallel block is formed of a lumped constant element; and the first parallel block is configured to open in impedance at the connection point to the second parallel block in the first frequency band.

6. A multiband matching circuit for matching an impedance $Z_1(f)$ of a circuit element having frequency dependence to a predetermined impedance Z0 of a system circuit in first to m-th frequency bands when the multiband matching circuit is disposed in a signal path between the circuit element having the impedance $Z_I(f)$ and the system circuit having the predetermined impedance Z0, where m≧3 and central frequencies $f_1 > f_2 > \ldots > f_m$, the multiband matching circuit comprising:

a first matching unit connected at one end to the circuit element and adapted to convert the impedance of the circuit element to Z0 in each of the first to (m−1)-th frequency bands;

a second matching unit which comprises:
 a first series matching section connected at one end to the other end of the first matching unit, which is a transmission line whose characteristic impedance is equal to the impedance Z0 of the system circuit or a circuit equivalent to the transmission line at least in each of the first to (m−1)-th frequency bands; and
 a first parallel matching section connected at one end to the signal path at the other end of the first series matching section and grounded at the other end; and a third matching unit which comprises:
 a second series matching section connected at one end to the other end of the first series matching section and connected at the other end to the system circuit, which is a transmission line whose characteristic impedance is equal to the impedance Z0 of the system circuit or a circuit equivalent to the transmission line at least in each of the first to (m−1)-th frequency bands; and
 a third parallel matching section connected at one end to the signal path at the other end of the second series matching section, which is an element or a circuit having a variable reactance;

the first parallel matching section being configured to open in impedance at a connection point to the signal path in the first to (m−1)-th frequency bands;

the first series matching section and the first parallel matching section being designed to make an impedance conversion ratio of an impedance $Z'(f_m)$, which is viewed from a connection point between the second matching unit and the third matching unit to the circuit element to the impedance Z0 of the system circuit smaller than an impedance conversion ratio of an impedance $Z(f_m)$, which is viewed from the connection point between the first matching unit and the second matching unit to the circuit element to the impedance Z0 of the system circuit, in the m-th frequency band, while the third parallel matching section provides the variable reactance according to the frequency characteristics of the third parallel matching section, and the second series matching section and the third parallel matching section being designed to convert the impedance $Z'(f_m)$ to Z0; and the multiband matching circuit matching the impedance of the circuit element with Z0 in one or more of the first to (m−1)-th frequency bands and the m-th frequency band selectively by the frequency characteristics of the third parallel matching section;

wherein the first parallel matching section comprises a second parallel block connected at one end to the signal path and a first parallel block connected at one end to the other end of the second parallel block and grounded at the other end;

the second parallel block is formed of a lumped constant element; and the first parallel block is configured to open in impedance at the connection point to the second parallel block in the first frequency band.

7. The multiband matching circuit according to one of claims 1 and 2, wherein the first parallel block is a parallel resonance circuit of a capacitor and an inductor, with the resonance frequency being equal to a central frequency $f_1$ of the first frequency band.

8. The multiband matching circuit according to claim 2, wherein the first parallel block is a transmission line having a length equal to a quarter of the wavelength at a central frequency $f_1$ of the first frequency band.

9. The multiband matching circuit according to claim 3 or 4 wherein the first parallel block is a parallel resonance circuit of a capacitor and an inductor, with the resonance frequency being greater than or equal to the central frequency $f_{m-1}$ of the (m−1)-th frequency band and smaller than or equal to the central frequency $f_1$ of the first frequency band.

10. The multiband matching circuit according claim 3 or 4, wherein the first parallel block is a series connection of m−1 parallel circuits of capacitors and inductors, with the resonance frequencies being the central frequencies $f_1$, $f_2, \ldots$, and $f_{m-1}$ of the first to (m−1)-th frequency bands, respectively.

11. The multiband matching circuit according to claim 5 or 6, wherein the first parallel block is a transmission line whose length is greater than or equal to a quarter of the wavelength at the central frequency $f_1$ of the first frequency band and smaller than or equal to a quarter of the wavelength at the central frequency $f_{m-1}$ of the (m−1)-th frequency band.

12. A multiband power amplifier comprising an amplification device and a multiband matching circuit according to one of claims 1, 3, 4, 5, and 6 and capable of amplifying signals in a plurality of frequency bands.

* * * * *